United States Patent
Mun et al.

(10) Patent No.: US 10,622,256 B2
(45) Date of Patent: Apr. 14, 2020

(54) METHOD OF MANUFACTURING SEMICONDUCTOR DEVICE USING MULTIPLE PATTERNING TECHNIQUES

(71) Applicants: Seung-Jin Mun, Suwon-si (KR); Dong-Hoon Khang, Daegu (KR); Woo-Ram Kim, Seoul (KR); Cheol Kim, Hwaseong-si (KR); Dong-Seok Lee, Seongnam-si (KR); Yong-Joon Choi, Seoul (KR); Seung-Mo Ha, Seoul (KR); Do-Hyoung Kim, Hwaseong-si (KR)

(72) Inventors: Seung-Jin Mun, Suwon-si (KR); Dong-Hoon Khang, Daegu (KR); Woo-Ram Kim, Seoul (KR); Cheol Kim, Hwaseong-si (KR); Dong-Seok Lee, Seongnam-si (KR); Yong-Joon Choi, Seoul (KR); Seung-Mo Ha, Seoul (KR); Do-Hyoung Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 534 days.

(21) Appl. No.: 15/083,248

(22) Filed: Mar. 28, 2016

(65) Prior Publication Data
US 2016/0307803 A1    Oct. 20, 2016

(30) Foreign Application Priority Data
Apr. 15, 2015  (KR) .................. 10-2015-0053284

(51) Int. Cl.
| | | |
|---|---|---|
| *H01L 21/308* | (2006.01) | |
| *H01L 21/8234* | (2006.01) | |
| *H01L 23/544* | (2006.01) | |

(52) U.S. Cl.
CPC .. *H01L 21/823431* (2013.01); *H01L 21/3086* (2013.01); *H01L 23/544* (2013.01);
(Continued)

(58) Field of Classification Search
CPC .................................................. H01L 21/3086
(Continued)

(56) References Cited

U.S. PATENT DOCUMENTS

| | | |
|---|---|---|
| 7,396,781 B2 | 7/2008 | Wells |
| 8,450,829 B2 | 5/2013 | Fischer et al. |

(Continued)

*Primary Examiner* — Hsin Yi Hsieh
(74) *Attorney, Agent, or Firm* — Muir Patent Law, PLLC

(57) ABSTRACT

A method of manufacturing a semiconductor device may include forming a sacrificial layer on a substrate including a first region and a second region, forming a first pattern on the sacrificial layer of the second region, forming a second pattern on the sacrificial layer of the first region, forming first upper spacers on opposite sidewalls of the second pattern, removing the second pattern, etching the first sacrificial layer of the first region using the first upper spacers as an etch mask to form a third pattern, etching the first sacrificial layer of the second region using the first pattern as an etch mask to form a fourth pattern, forming first lower spacers at either side of the third pattern, forming second spacers on opposite sidewalls of the fourth pattern, removing the third pattern and the fourth pattern, and etching the substrate using the first lower spacers and the second spacers as etch masks.

20 Claims, 16 Drawing Sheets

(52) U.S. Cl.
CPC ............... *H01L 2223/54426* (2013.01); *H01L 2223/54453* (2013.01)

(58) Field of Classification Search
USPC ........................................................ 438/702
See application file for complete search history.

(56) References Cited

U.S. PATENT DOCUMENTS

| | | |
|---|---|---|
| 8,603,884 B2 | 12/2013 | Sills et al. |
| 8,674,512 B2 | 3/2014 | Sandhu et al. |
| 8,785,325 B2 | 7/2014 | Sudo |
| 8,829,602 B2 | 9/2014 | Juengling |
| 8,852,851 B2 | 10/2014 | Zhou et al. |
| 8,921,034 B2 | 12/2014 | Hopkins |
| 2012/0220132 A1 | 8/2012 | Oyama et al. |
| 2014/0083972 A1 | 3/2014 | Oyama et al. |
| 2014/0256144 A1 | 9/2014 | Lo et al. |
| 2014/0273441 A1 | 9/2014 | Kim et al. |
| 2015/0318181 A1* | 11/2015 | Cantone .......... H01L 21/823431 438/702 |
| 2016/0225633 A1* | 8/2016 | Kim .................. H01L 29/66795 |

* cited by examiner

1200

1300

1400

METHOD OF MANUFACTURING SEMICONDUCTOR DEVICE USING MULTIPLE PATTERNING TECHNIQUES

CROSS-REFERENCE TO RELATED APPLICATION

This application claims the benefit of priority under 35 U.S.C. § 119 to Korean Patent Application No. 10-2015-0053284, filed on Apr. 15, 2015, in the Korean Intellectual Property Office, the disclosure of which is incorporated herein in its entirety by reference.

BACKGROUND

Example embodiments of the inventive concepts relate to methods of manufacturing a semiconductor device.

As integration density of a semiconductor device increases, design rules for components of the semiconductor device have been reduced. In manufacturing a semiconductor device having a fine pattern in accordance with the trend of high integration of semiconductor devices, it is beneficial to realize a pattern having a fine line width beyond a resolution limit of a photolithography equipment.

SUMMARY

Example embodiments of the inventive concepts provide methods of manufacturing a semiconductor device including fin-shaped patterns having various pitches through a simplified process.

Example embodiments of the inventive concepts also provide methods of manufacturing a semiconductor device including a fin-shaped pattern of a fine line width and a trench key through a simplified process.

According to some example embodiments of the inventive concepts, a method of manufacturing a semiconductor device may include forming a first sacrificial layer on a substrate including a first region and a second region, forming a first pattern on the first sacrificial layer of the first region and a first mark generation layer on the first sacrificial layer of the second region, forming a first key pattern on the first mark generation layer, forming a first mark generation pattern by partially etching the first mark generation layer using the first key pattern as an etch mask, forming a second pattern by etching the first sacrificial layer of the first region using the first pattern as an etch mask, forming a second key pattern by etching the first sacrificial layer of the second region using the first mark generation pattern as an etch mask, forming first spacers on sidewalls of the second pattern and first key spacers on sidewalls of the second key pattern, forming first fin-shaped patterns in the first region by partially etching the substrate using the first spacers as etch masks, and forming a trench key in the second region.

The method may further include forming a second mark generation layer between the substrate and the first sacrificial layer in the second region. The second key pattern may be formed on the second mark generation layer to overlap with the second mark generation layer.

The method may include forming a second mark generation pattern by etching the second mark generation layer using the second key pattern and the first key spacers as etch masks, removing the second key pattern, and forming the trench key by partially etching the substrate using the second mark generation pattern as an etch mask.

The method may further include forming a mask layer between the substrate and the second mark generation layer.

The mask layer may include a lower mask layer and an upper mask layer sequentially stacked on the substrate and the second mark generation layer may include a material that has a high etch selectivity with respect to the upper mask layer.

The method may further include etching the mask layer using the second mark generation pattern as an etch mask to form a mask pattern.

The method may include etching the substrate using the mask pattern as an etch mask to form the trench key.

The method may further include forming a blocking pattern covering the first pattern in the first region. The step of forming the blocking pattern may be performed by the same photolithography process forming the first key pattern.

The method may include forming a second sacrificial layer covering the first pattern and the first mark generation layer on the first sacrificial layer, and patterning the second sacrificial layer to form the first key pattern and the blocking pattern.

The method may include forming second key spacers on sidewalls of the first key pattern and forming a recess in the first mark generation layer by partially etching the first mark generation layer using the first key pattern and the second key spacers as etch masks to form the first mark generation pattern.

The method may include, after removing the first key pattern, etching the first sacrificial layer using the second key spacers and the first mark generation pattern as etch masks to form the second key pattern.

The substrate may be provided to further include a third region. The method may further include forming a third pattern on the first sacrificial layer of the third region with the same process forming the first key pattern.

The method may further include forming second spacers on sidewalls of the third pattern, forming a fourth pattern by etching the first sacrificial layer using the second spacers as etch masks, forming third spacers on sidewalls of the fourth pattern, and forming second fin-shaped patterns in the third region, by partially etching the substrate using the third spacers as etch masks.

A first pitch of the first fin-shaped patterns may be formed to be greater than a second pitch of the second fin-shaped patterns.

The first mark generation layer is not formed in the first region.

According to some example embodiments of the inventive concepts, a method of manufacturing a semiconductor device may include forming a mask layer on a substrate including a first region and a second region, forming a first mark generation layer on the mask layer of the second region, forming a first sacrificial layer covering the first mark generation layer on the mask layer, forming a second mark generation layer overlapping the first mark generation layer on the first sacrificial layer of the second region, forming a first pattern on the first sacrificial layer of the first region and a first key pattern on the second mark generation layer of the second region, forming first spacers on sidewalls of the first pattern and first key spacers on sidewalls of the first key pattern, forming a second mark generation pattern by etching the second mark generation layer using the first key pattern and the first key spacers as etch masks, forming a second pattern by etching the first sacrificial layer using the first spacers as etch masks, forming a second key pattern on the first mark generation layer by etching the first sacrificial layer using the second mark generation pattern and the first key spacers as etch masks, forming second spacers on the sidewalls of the second pattern and second key spacers on sidewalls of the second key pattern, forming a first mark generation pattern by etching the first mark generation layer using the second key pattern and the second key spacers as etch masks, forming first fin-shaped patterns in the first region by partially etching the mask layer and the substrate using the second spacers as etch masks, and forming a trench key in the second region.

The method may include, removing the second key pattern after forming the first mark generation pattern, and partially etching the mask layer and the substrate using the first mark generation pattern and the second key spacers as etch masks to form the trench key.

The method may include removing the first key pattern after forming the second mark generation pattern, and before forming the second key pattern.

The forming of the second mark generation pattern may include forming a recess in the second mark generation layer by etching a portion of the second mark generation layer that is not overlapped with the first key pattern and the first key spacers.

The forming of the second key pattern may include, after removing the first key pattern, etching the first sacrificial layer using a thickness difference of the second mark generation pattern.

The first key pattern may be concurrently formed with the first pattern.

The substrate may be provided to further include a third region. The method may further comprises forming a third pattern on the first sacrificial layer of the third region concurrently with the second mark generation layer, forming a fourth pattern in the third region by etching the first sacrificial layer using the third pattern as an etch mask concurrently with the second key pattern, forming third spacers on sidewalls of the fourth pattern and forming second fin-shaped patterns having pitches different from those of the first fin-shaped patterns in the third region by partially etching the mask layer and the substrate using the third spacers as etch masks.

The method may further include forming a second sacrificial layer covering the third pattern and the second mark generation layer on the first sacrificial layer and forming the first pattern, the first key pattern, and a blocking pattern covering the third pattern by patterning the second sacrificial layer.

According to some example embodiments of the inventive concepts, a method of manufacturing a semiconductor device may include sequentially forming a mask layer, a first mark generation layer and a first sacrificial layer on a substrate including a first region, a second region and a third region, forming a first pattern on the first sacrificial layer of the second region and a second mark generation layer on the first sacrificial layer of the third region, forming a second pattern on the first sacrificial layer of the first region, a blocking pattern covering the first pattern, and a first key pattern on the second mark generation layer, forming first spacers on sidewalls of the second pattern and first key spacers on sidewalls of the first key pattern, forming a second mark generation pattern by partially etching the second mark generation layer using the first key pattern and the first key spacers as etch masks, removing the second pattern, the blocking pattern and the first key pattern after forming of the second mark generation pattern, forming a third pattern in the first region by etching the first sacrificial layer using the first spacers as etch masks, forming a fourth pattern in the second region by etching the first sacrificial layer using the first pattern as an etch mask, forming a second key pattern on the first mark generation layer by etching the first sacrificial layer using the second mark generation pattern as an etch mask, forming second spacers on sidewalls of the third pattern, third spacers on sidewalls of the fourth pattern, and second key spacers of sidewalls of the second key pattern, and forming a first mark generation pattern exposing a top surface of the mask layer by etching the first mark generation layer using the second key pattern and the second key spacers as etch masks. The first mark generation layer may be formed between the mask layer and the first sacrificial layer in the third region, The method may further include removing the second key pattern, the third pattern, and the fourth pattern, and forming first fin-shaped patterns in the first region, second fin-shaped patterns in the second region and a trench key in the third region using the second spacers, the third spacers and the first mark generation pattern, respectively.

The first pattern may be concurrently formed with the second mark generation layer.

The second mark generation layer may be formed to overlap the first mark generation layer.

The second pattern, the blocking pattern, and the first key pattern may be formed to be spaced apart from each other.

The method may include forming a second sacrificial layer covering the first pattern and the second mark generation layer on the first sacrificial layer, and patterning the second sacrificial layer to form the second pattern, the blocking pattern, and the first key pattern.

According to some embodiments, a method of manufacturing a semiconductor device includes providing a substrate including a first region and a second region, forming a first sacrificial layer on the substrate, forming a first pattern on the first sacrificial layer of the second region, forming a second pattern on the first sacrificial layer of the first region, forming first upper spacers on opposite sidewalls of the second pattern, removing the second pattern, etching the first sacrificial layer of the first region using the first upper spacers as an etch mask to form a third pattern, etching the first sacrificial layer of the second region using the first pattern as an etch mask to form a fourth pattern, forming first lower spacers at either side of the third pattern, forming second spacers on opposite sidewalls of the fourth pattern, removing the third pattern and the fourth pattern, and etching the substrate using the first lower spacers and the second spacers as etch masks.

The method may include forming a mask layer between the substrate and the first sacrificial layer. The step etching the substrate using the first lower spacers and the second spacers as etch masks may etch the mask layer first to form a mask pattern, and the etching the substrate may use the mask pattern, the first lower spacers, and the second spacers as etch masks.

The mask layer may include two or more different layers. The step etching the first sacrificial layer of the first region using the first upper spacers as an etch mask to form the third pattern may be performed at the same process as the step etching the first sacrificial layer of the second region using the first pattern as an etch mask to form the fourth pattern.

The step forming the first pattern on the first sacrificial layer of the second region may be performed in a different photolithography process than the step forming the second pattern on the first sacrificial layer of the first region.

The method may include forming a first capping layer on the first sacrificial layer, and forming a preliminary layer on the first sacrificial layer, wherein the preliminary layer may have an etch selectivity with respect to the first capping layer, and the first pattern is formed by patterning the preliminary layer by a photolithography process.

The method may include forming a second sacrificial layer on the first pattern and the first capping layer, and forming a blocking pattern covering the first pattern by patterning the second sacrificial layer of the second region, wherein the second pattern is formed by patterning the second sacrificial layer of the first region. The second sacrificial layer may have an etch selectivity with respect to the first pattern, the first upper spacer, and the first capping layer, and the blocking pattern is removed by the same process removing the second pattern.

The method may include forming a mask layer on the substrate, forming a first mark generation layer on the mask layer of a third region of the substrate, forming a second mark generation layer overlapping the first mark generation layer, wherein the second mark generation layer may be formed by the same photolithography process forming the first pattern.

The method may include etching the first mark generation layer to form a first mark generation pattern, etching the mask layer using the first mark generation pattern as an etch mask to form a mask pattern, and etching the substrate using the mask pattern as an etch mask to form a trench key.

BRIEF DESCRIPTION OF THE DRAWINGS

Example embodiments of the inventive concepts will be more clearly understood from the following detailed description taken in conjunction with the accompanying drawings.

FIGS. 1 through 14 are cross-sectional views illustrating intermediate steps of a method of manufacturing a semiconductor device according to an example embodiment of the inventive concepts.

FIGS. 15 through 21 are views illustrating a method of manufacturing a fin-type field effect transistor (FinFET) using a semiconductor device manufactured according to an embodiment of the inventive concepts.

FIG. 22 illustrates a block diagram of a system-on-chip (SoC) system including a semiconductor device manufactured according to an embodiment of the inventive concepts.

FIG. 23 illustrates a block diagram of an electronic device including a semiconductor device manufactured according to an embodiment of the inventive concepts.

FIGS. 24 through 26 illustrate electronic devices including a semiconductor device manufactured according to an embodiment of the inventive concepts.

DETAILED DESCRIPTION

Figure 1:
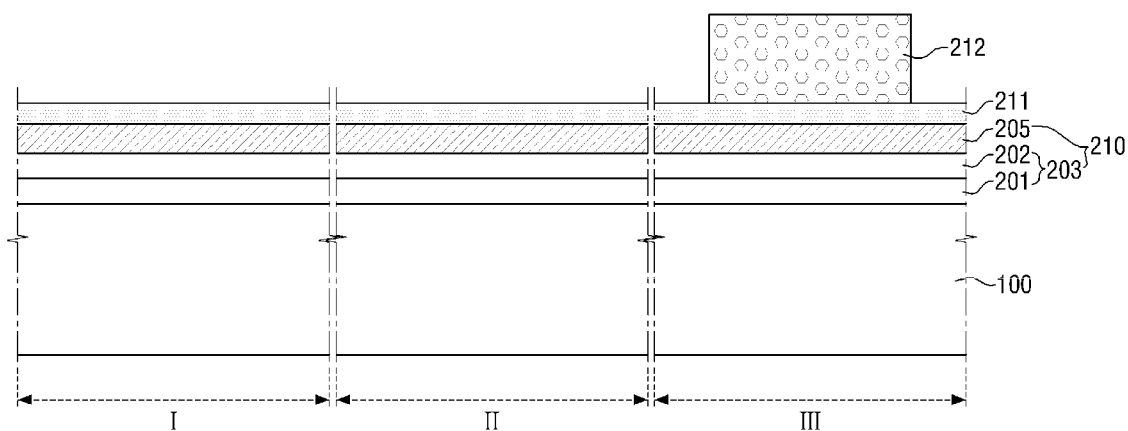
FIGS. 1 through 26 represent non-limiting, example embodiments as described herein.

Hereinafter, example embodiments of the inventive concepts will be described with reference to the accompanying drawings. The inventive concepts may, however, be embodied in many different forms and should not be construed as being limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. It should be understood that there is no intent to limit the inventive concepts to the particular forms disclosed, but on the contrary, the inventive concepts are to cover all modifications, equivalents, and alternatives falling within the spirit and scope of the inventive concepts. Like reference numerals denote like elements throughout the specification and drawings. In the drawings, the dimensions of structures are exaggerated or reduced for clarity of the inventive concepts.

Also, though terms "first" and "second" are used to describe various members, components, regions, layers, and/or portions in various embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

As used herein, a semiconductor device may refer to any of the various devices such as shown in FIGS. 1-21, and may also refer, for example, to two transistors or a device such as a semiconductor chip (e.g., memory chip and/or logic chip), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

As in the following, a method of manufacturing a semiconductor device according to an example embodiment of the inventive concepts will be described in detail with reference to FIGS. 1 through 14.

FIGS. 1 through 14 are cross-sectional views illustrating intermediate steps of a method of manufacturing a semiconductor device according to an example embodiment of the inventive concepts. For reference, FIG. 7B is an enlarged view of a portion O of FIG. 7A. In addition, FIGS. 1 through 14 illustrate a process in which a semiconductor device is manufactured in different regions.

Referring to FIG. 1, a mask layer 210 may be formed on a substrate 100 including a first region I, a second region II, and a third region III.

The first region I, the second region II, and the third region III may be spaced apart from each other or may be connected to each other.

In a method of manufacturing a semiconductor device according to an example embodiment of the inventive concepts, the first region I may be a region for forming a fin-shaped pattern using a quadruple patterning technology (QPT), the second region II may be a region for forming a fin-shaped pattern using a double patterning technology (DPT), and the third region III may be a region for forming a trench key.

The substrate 100 may be, for example, a silicon substrate. The silicon substrate may include a bulk silicon substrate or a silicon-on-insulator (SOI). On the other hand, the substrate 100 may include an element semiconductor (e.g., germanium), or a compound semiconductor (e.g., a IV-IV group compound semiconductor or a III-V group compound semiconductor). The substrate 100 may be a substrate where an epitaxial layer is disposed on a base substrate.

The IV-IV group compound semiconductor may be a binary compound or a ternary compound, each of which contains at least two or more of carbon (C), silicon (Si), germanium (Ge), and tin (Sn). The binary compound and the ternary compound may be doped with an IV group element.

The III-V group compound semiconductor may be a binary compound, a ternary compound, or a quarternary compound, each of which contains at least one of aluminium (Al), gallium (Ga), and indium (In) as a III group element and at least one of phosphorus (P), arsenic (As), and antimonium (Sb) as a V group element.

The mask layer 210 may include a lower mask layer 203 and an upper mask layer 205 sequentially stacked on the substrate 100. The lower mask layer 203 may include a first lower mask layer 201 and a second lower mask layer 202.

Each of the first lower mask layer 201, the second lower mask layer 202 and the upper mask layer 205 may include a silicon-containing material, (e.g., silicon oxide SiOx, silicon oxynitride SiON, silicon nitride SixNy, tetraethylothosilicate TEOS, or polycrystalline silicon), a carbon-containing material, (e.g., amorphous carbon layer ACL, or spin-on-hardmask SOH), a metal, or a combination thereof.

In an example embodiment, the first lower mask layer 201 may include silicon nitride, the second lower mask layer 202 may include silicon oxide, and the upper mask layer 205 may include polycrystalline silicon. The first lower mask layer 201 may further include silicon oxide under the silicon nitride.

The first lower mask layer 201, the second lower mask layer 202, and the upper mask layer 205 each may be formed through a process such as an atomic layer deposition (ALD), a chemical vapour deposition (CVD), or a spin coating. A baking process or a hardening process may be further performed.

Next, a first preliminary mark generation layer 211 may be formed on the mask layer 210. The first preliminary mark generation layer 211 may have an etch selectivity with respect to the upper mask layer 205 that is disposed thereunder. For example, the first preliminary mark generation layer 211 may have a high etch selectivity with respect to the upper mask layer 205.

The first preliminary mark generation layer 211 may include a silicon-containing material (e.g., silicon oxide SiOx, silicon oxynitride SiON, silicon nitride SixNy, tetraethylothosilicate TEOS, or polycrystalline silicon), a carbon-containing material (e.g., amorphous carbon layer ACL, or spin-on-hardmask SOH), a metal, or a combination thereof.

In an example embodiment, the first preliminary mark generation layer 211 may include silicon oxide. The first preliminary mark generation layer 211 may be formed through an ALD process or a CVD process, but the invention is not limited thereto.

Next, a first photoresist layer pattern 212 may be formed on the first preliminary mark generation layer 211 of the third region III.

After forming a photoresist (PR) layer on the first preliminary mark generation layer 211, the first photoresist layer pattern 212 may be formed through a photolithography process.

In FIG. 1, for convenience of explanation, the first photoresist layer pattern 212 is depicted as a single layer, but the invention is not limited thereto. For example, the first photoresist layer pattern 212 may include an anti-reflection layer for preventing reflection of light from a lower layer during a photolithography process. The anti-reflection layer may include, for example, bottom anti-reflective coating (BARC) and/or developable bottom anti-reflective coating (dBARC), but it the invention not limited thereto.

Figure 2:
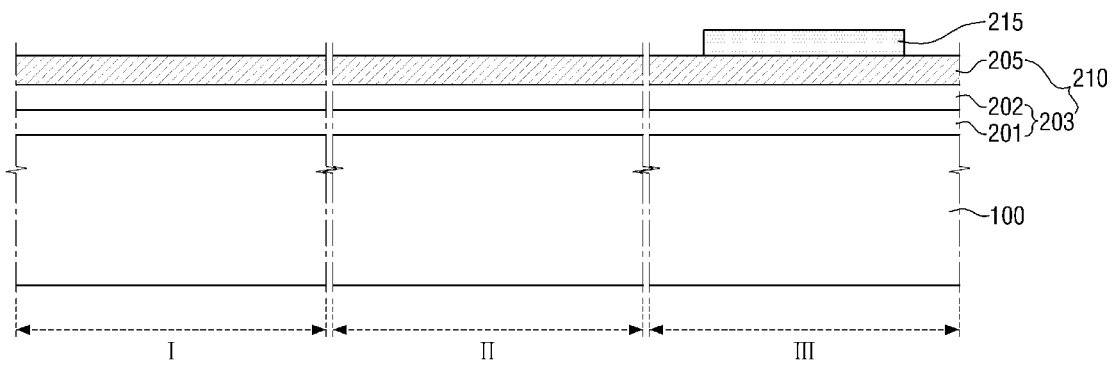

Referring to FIG. 2, the first preliminary mark generation layer 211 may be patterned using the first photoresist layer pattern 212 as an etch mask.

Through etching the first preliminary mark generation layer 211, the first preliminary mark generation layer 211 in the first region I and the second region II may be removed, and a first mark generation layer 215 may be formed on the third region III.

For example, the first mark generation layer 215 may be formed on the mask layer 210 of the third region III. The first mark generation layer 215 may not be formed on the mask layer 210 in the first region I and the second region II.

Figure 3:
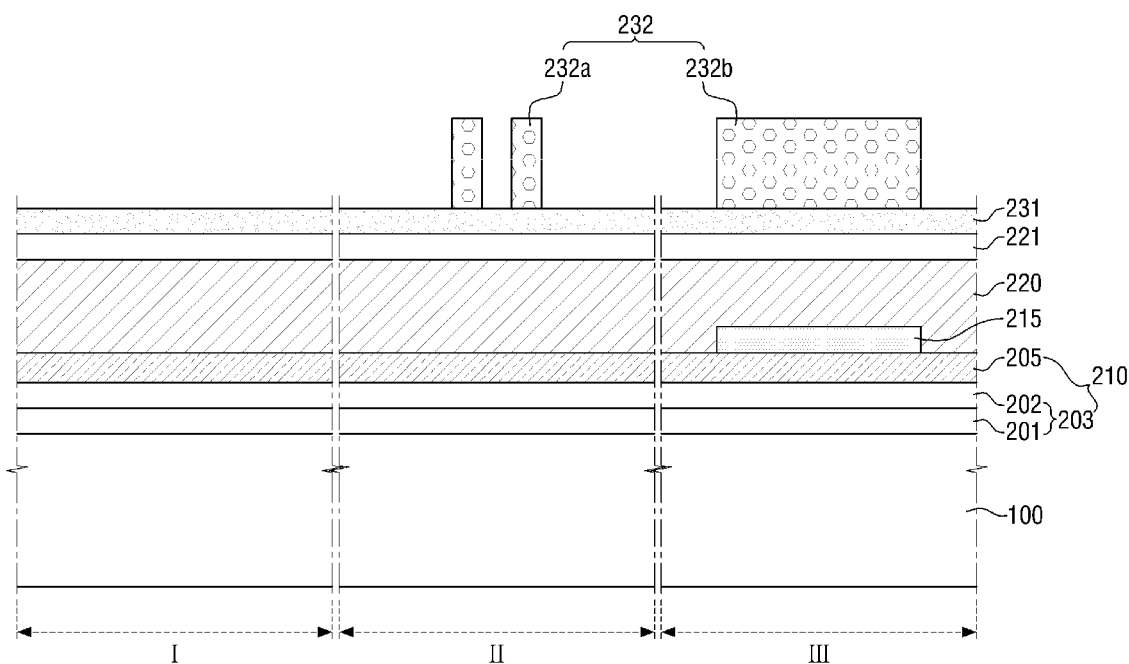

Referring to FIG. 3, a first sacrificial layer 220 and a first capping layer 221 may be sequentially formed on the mask layer 210.

The first sacrificial layer 220 may cover the first mark generation layer 215 of the third region III. The first sacrificial layer 220 may include polycrystalline silicon, an amorphous carbon layer (ACL), a spin-on-hardmask (SOH), or a combination thereof.

The first sacrificial layer 220 may be a layer for forming a mandrel pattern in a following process. Therefore, the first sacrificial layer 220 may include a material having an etch selectivity with respect to the upper mask layer 205. For example, the upper mask layer 205 may include polycrystalline silicon, and the first sacrificial layer 220 may include an amorphous carbon layer (ACL) and/or a spin-on-hardmask (SOH).

The first capping layer 221 may include, for example, silicon oxynitride (SiON).

Each of the first sacrificial layer 220 and the first capping layer 221 may be formed through an ALD process, a CVD process, or a spin coating process. A baking process or a hardening process may be further performed.

Next, a second preliminary mark generation layer 231 may be formed on the first capping layer 221. The second preliminary mark generation layer 231 may include a silicon-containing material (e.g., silicon oxide SiOx, silicon oxynitride SiON, silicon nitride SixNy, tetraethylothosilicate TEOS, or polycrystalline silicon), a carbon-containing material (e.g., ACL or SOH), a metal, or a combination thereof.

For example, the second preliminary mark generation layer 231 may include silicon oxide. The second preliminary mark generation layer 231 may be formed through an ALD process, or a CVD process, but the invention is not limited thereto.

Next, a second photoresist layer pattern 232 may be formed on the second preliminary mark generation layer 231. The second photoresist layer pattern 232 may include a first portion 232a and a second portion 232b. The first portion 232a of the second photoresist layer pattern 232 may be formed on the second preliminary mark generation layer 231 of the second region II, and the second portion 232b of the second photoresist layer pattern 232 may be formed on the second preliminary mark generation layer 231 of the third region III. The second portion 232b of the second photoresist layer pattern 232 may be formed to be vertically overlapped with the first mark generation layer 215 that is disposed thereunder.

After forming a photoresist (PR) layer on the second preliminary mark generation layer 231, the second photoresist layer pattern 232 may be formed through a photolithography process. In FIG. 3, for convenience of explanation, the second photoresist layer pattern 232 is depicted as a single layer, but the invention is not limited thereto.

For example, the second photoresist layer pattern 232 may include an anti-reflection layer for preventing reflection of light from a lower layer during a photolithography process. The anti-reflection layer may include, for example, bottom anti-reflective coating (BARC), and/or developable bottom anti-reflective coating (dBARC), but the invention is not limited thereto.

Figure 4:
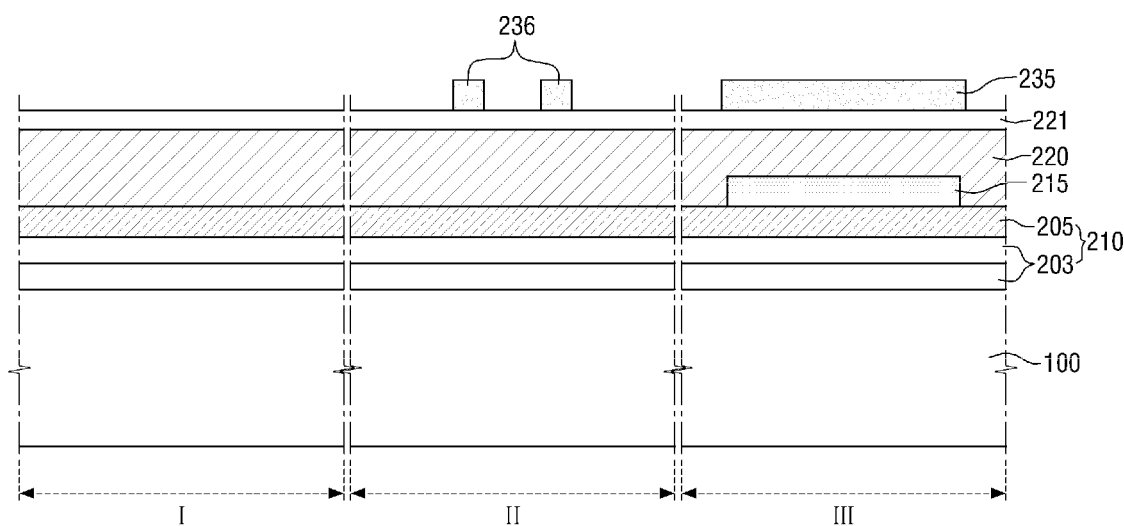

Referring to FIG. 4, the second preliminary mark generation layer 231 may be patterned using the second photoresist layer pattern 232 as an etch mask.

Through etching the second preliminary mark generation layer 231, the second preliminary mark generation layer 231 of the first region I may be removed. A first pattern 236 (i.e., a first mandrel pattern) and a second mark generation layer 235 may be formed on the first capping layer 221 through etching the second preliminary mark generation layer 231 using the second photoresist layer pattern 232 of the second region II and the third region III. For example, the second preliminary mark generation layer 231 may have a high etch selectivity with respect to the first capping layer 221.

The first pattern 236 may be formed in the second region II in which the first portion 232a of the second photoresist layer pattern 232 is positioned. The second mark generation layer 235 may be formed in the third region III in which the second portion 232b of the second photoresist layer pattern 232 is positioned. In this example, no pattern is formed on the first capping layer 221 of the first region I by etching the second preliminary mark generation layer 231.

The first pattern 236 and the second mark generation layer 235 may be formed through the same etching process. For example, the first pattern 236 and the second mark generation layer 235 may be concurrently formed on the first capping layer 221. Since the second mark generation layer 235 corresponds to the portion of the second preliminary mark generation layer 231 that is covered by the second portion 232b of the second photoresist layer pattern 232, the second mark generation layer 235 may overlap the first mark generation layer 215 that is disposed thereunder.

Although the embodiment in FIG. 4 is depicted as comprising two discrete first patterns 236, the invention is not limited thereto. For example, some embodiments may comprise one first pattern 236, or may comprise three or more discrete first patterns 236.

However, in the case where the first pattern 236 is two or more, the distance between the first patterns 236 may be determined in consideration of a distance between second fin-shaped patterns 120 of the second region II that are formed in later processes (See FIG. 13).

Figure 5:
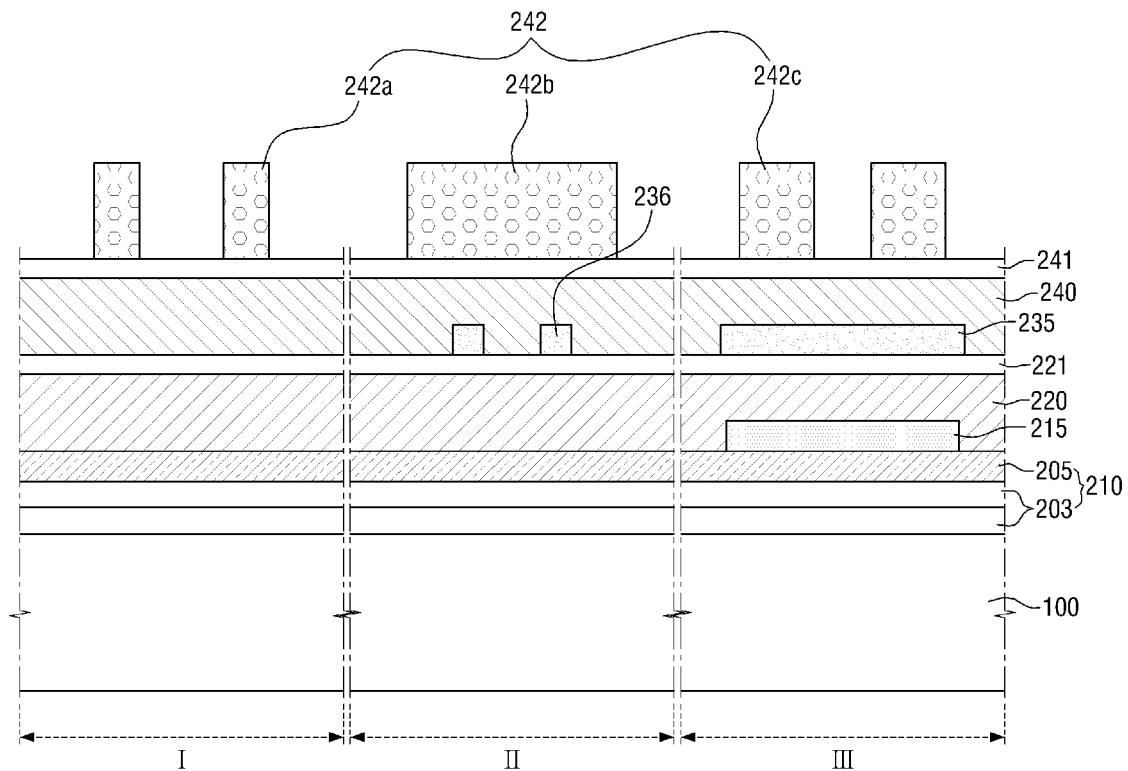

Referring to FIG. 5, a second sacrificial layer 240 and a second capping layer 241 may be sequentially formed on the first capping layer 221.

The second sacrificial layer 240 may cover the first pattern 236 of the second region II and the second mark generation layer 235 of the third region III. The second sacrificial layer 240 may include polycrystalline silicon, an amorphous carbon layer (ACL), a spin-on-hardmask (SOH), or a combination thereof. The second capping layer 241 may include, for example, silicon oxynitride (SiON).

Each of the second sacrificial layer 240 and the second capping layer 241 may be formed through an ALD process, a CVD process, or a spin coating process. A baking process or a hardening process may be further performed.

Next, a third photoresist layer pattern 242 may be formed on the second capping layer 241. The third photoresist layer pattern 242 may include a first portion 242a, a second portion 242b, and a third portion 242c. The first portion 242a of the third photoresist layer pattern 242 may be formed on the second capping layer 241 of the first region I, the second portion 242b of the third photoresist layer pattern 242 may be formed on the second capping layer 241 of the second region II, and the third portion 242c of the third photoresist layer pattern 242 may be formed on the second capping layer 241 of the third region III.

The second portion 242b of the third photoresist layer pattern 242 may overlap the first pattern 236 that is disposed thereunder, and the third portion 242c of the third photoresist layer pattern 242 may overlap the second mark generation layer 235 that is disposed thereunder.

After forming a photoresist (PR) layer on the second capping layer 241, the third photoresist layer pattern 242 may be formed through a photolithography process. In FIG. 5, for convenience of explanation, the third photoresist layer pattern 242 is depicted as a single layer, but the invention is not limited thereto.

For example, the third photoresist layer pattern 242 may include an anti-reflection layer for preventing reflection of light from a lower layer during a photolithography process. The anti-reflection layer may include, for example, bottom anti-reflective coating (BARC) and/or developable bottom anti-reflective coating (dBARC), but the invention is not limited thereto.

Figure 6:
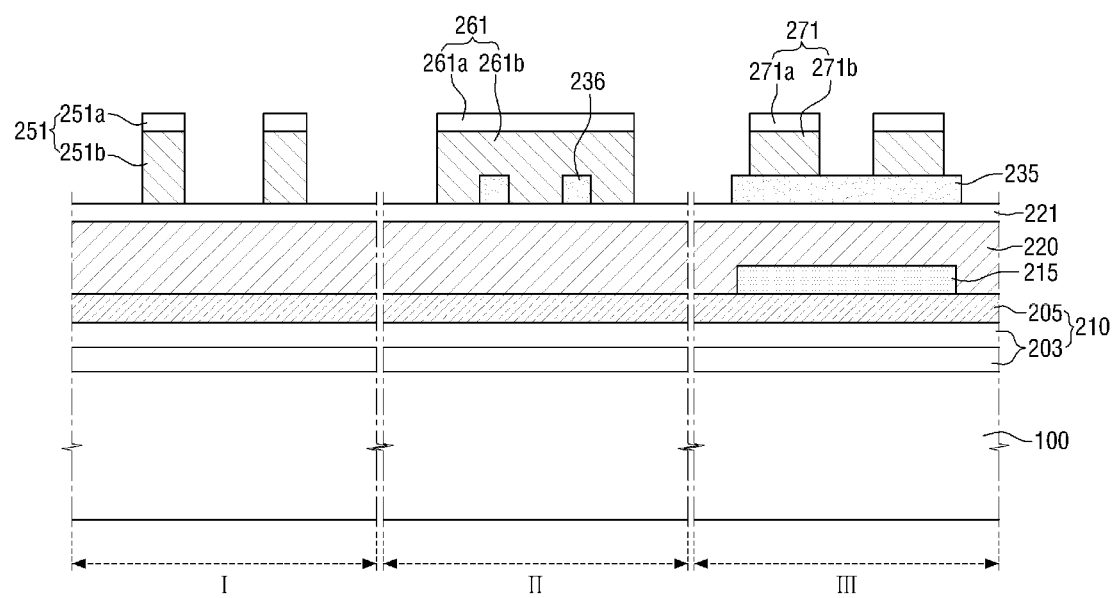

Referring to FIG. 6, the second capping layer 241 and the second sacrificial layer 240 may be patterned using the third photoresist layer pattern 242 as an etch mask.

Through etching the second capping layer 241 and the second sacrificial layer 240, a second pattern 251 (i.e., a second mandrel pattern), a blocking pattern 261, and an upper key pattern 271 may be formed, respectively. The second pattern 251, the blocking pattern 261, and the upper key pattern 271 may be spaced apart from each other. For example, the second sacrificial layer 240 may have a high etch selectivity with respect to the first capping layer 221 and/or with respect to the second mark generation layer 235.

In an example embodiment, the second pattern 251, the blocking pattern 261, and the upper key pattern 271 may be concurrently formed.

The second pattern 251 may be formed in the first region I where the first portion 242a of the third photoresist layer pattern 242 is positioned. The second pattern 251 that is disposed on the first capping layer 221 of the first region I may include first portions 251a and 251b. The first portion 251b may be formed from the second sacrificial layer 240 and the first portion 251a may be formed from the second capping layer 241.

The blocking pattern 261 may be formed in the second region II where the second portion 242b of the third photoresist layer pattern 242 is positioned. Since the second portion 242b of the third photoresist layer pattern 242 is formed to overlap with the first pattern 236 that is disposed thereunder, the blocking pattern 261 may overlap the first pattern 236. For example, the blocking pattern 261 that is disposed on the first capping layer 221 of the second region II may cover the first pattern 236.

The blocking pattern 261 may include second portions 261a and 261b. The second portion 261b is formed from the second sacrificial layer 240 and the second portion 261a is formed from the second capping layer 241.

An upper key pattern 271 may be formed in the third region III where the third portion 242c of the third photoresist layer pattern 242 is positioned. The upper key pattern 271 may be formed on the second mark generation layer 235. For example, the upper key pattern 271 may be formed to overlap with the second mark generation layer 235.

The upper key pattern 271 may be formed to overlap the first mark generation layer 215.

The upper key pattern 271 may include third portions 271a and 271b. The third portion 271b may be formed from the second sacrificial layer 240 and the third portion 271a may be formed from the second capping layer 241.

Figure 7A:
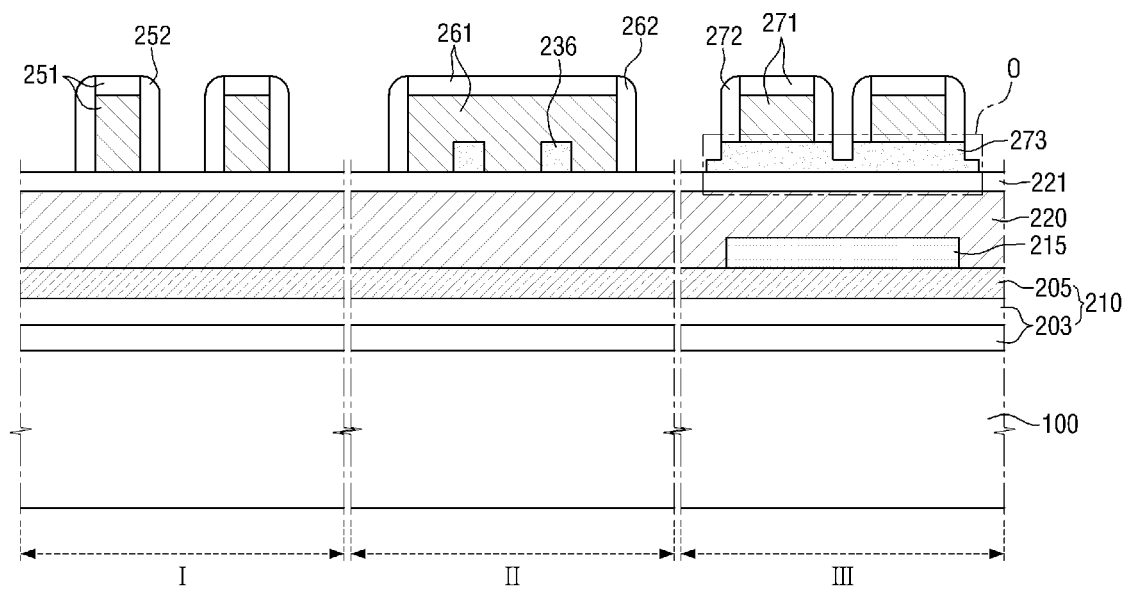
Figure 7B:
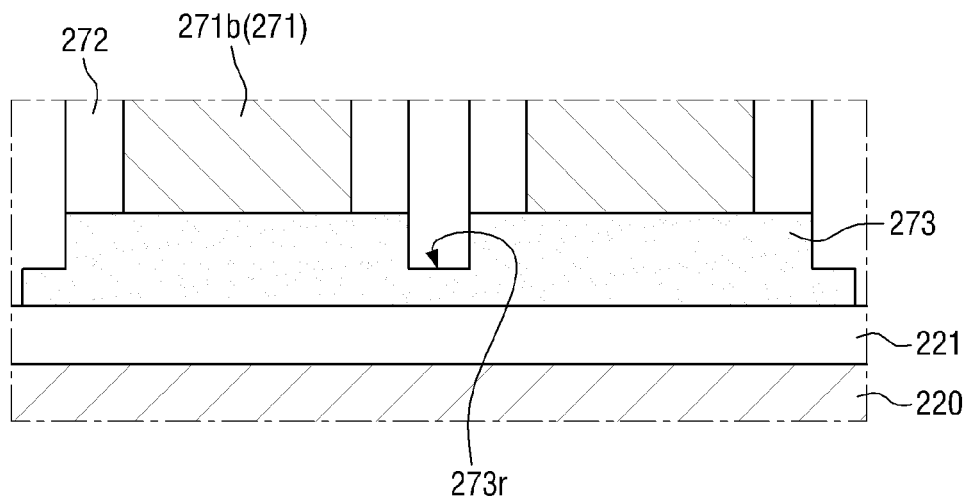

Referring to FIGS. 7A and 7B, a plurality of first upper spacers 252 may be formed on sidewalls of the second pattern 251, and a plurality of first key spacers 272 may be formed on sidewalls of the upper key pattern 271. A plurality of first dummy spacers 262 may be formed on sidewalls of the blocking pattern 261.

For example, the first upper spacers 252 may be formed on the first capping layer 221 of the first region I, the first dummy spacers 262 may be formed on the first capping layer 221 of the second region II, and the first key spacers 272 may be formed on the second mark generation pattern 273 of the third region III.

For example, a first spacer formation layer may be formed to conformally cover the second pattern 251, the blocking pattern 261, and the upper key pattern 271. Next, through performing an etch-back process, the first upper spacers 252 on the sidewalls of the second pattern 251, the first dummy spacers 262 on the sidewalls of the blocking pattern 261, and the first key spacers 272 on the sidewalls of the upper key pattern 271 are formed, respectively.

The thickness of the first spacer formation layer may be determined in consideration of a distance between first fin-shaped patterns 110 of the first region I that are formed by later processes (See FIG. 13). The distance between the first fin-shaped patterns 110 that are formed by later processes may be less than the resolution limit of conventional photolithography equipment.

The first spacer formation layer may include a material that has an etch selectivity with respect to the second pattern 251, the blocking pattern 261, and the upper key pattern 271. For example, if each of the second pattern 251, the blocking pattern 261 and the upper key pattern 271 includes polycrystalline silicon, an amorphous carbon layer (ACL), a spin-on-hardmask (SOH), or a combination thereof, the first spacer formation layer may include silicon oxide and/or silicon nitride. The first spacer formation layer may be formed through, for example, an ALD process.

In a manufacturing method of a semiconductor device according to some example embodiments of the inventive concepts, the first upper spacers 252 and the first key spacers 272 may include silicon oxide.

At least a portion of the second mark generation layer 235 (See FIG. 6) may be removed using the first key spacers 272 and the upper key pattern 271 as etch masks. Accordingly, a second mark generation pattern 273 may be formed on the first capping layer 221 of the third region III.

The second mark generation pattern 273 may be disposed between the first capping layer 221 and the upper key pattern 271.

For example, after forming the first key spacers 272 on the second mark generation layer 235 (See FIG. 6), a recess 273r may be formed in the second mark generation layer 235 (See FIG. 6) by etching at least a portion of the second mark generation layer 235 (See FIG. 6) that is not overlapped with the first key spacers 272 and the upper key pattern 271.

Therefore, the second mark generation pattern 273 may be formed to include the recess 273r.

In FIGS. 7A and 7B, the second mark generation pattern 273 may cover the first capping layer 221 that is formed thereunder, but the invention is not limited thereto. For example, the first capping layer 221 may be partially exposed.

Figure 8:
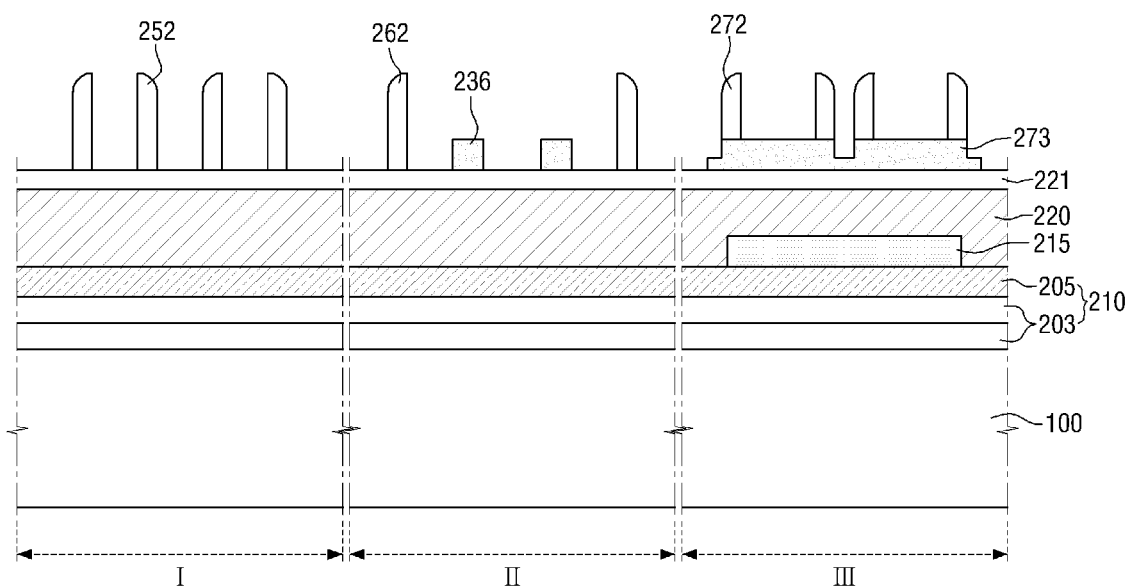

Referring to FIG. 8, the second pattern 251, the blocking pattern 261, and the upper key pattern 271 may be removed.

Through selectively removing the second pattern 251, the first upper spacers 252 may be left in the first region I.

Through selectively removing the blocking pattern 261 and the upper key pattern 271, the first dummy spacers 262 and the first pattern 236 covered by the blocking pattern 261 may be left in the second region II, and the first key spacers 272 and the second mark generation pattern 273 may be left in the third region III. For example, removing the second pattern 251, the blocking pattern 261, and the upper key pattern 271 may use a wet etch process or a dry etch process. In this etch process, the second pattern 251, the blocking pattern 261, and the upper key pattern 271 may have etch selectivity with respect to the first capping layer 221 and with respect to the first upper spacers 252, the first pattern 236, and the first key spacers 272. For example, the etch rates of the second capping layer 241 and the second sacrificial layer 240 are faster than the etch rate of the first capping layer 221.

Figure 9:
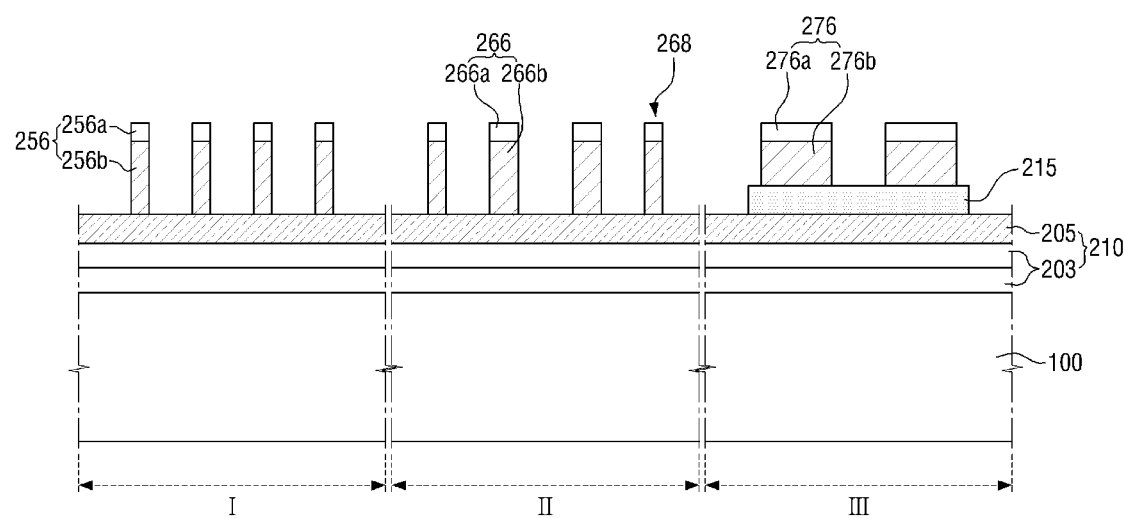

Referring to FIG. 9, the first capping layer 221 and the first sacrificial layer 220 may be patterned using the first upper spacers 252, the first dummy spacers 262, the first pattern 236, the second mark generation pattern 273, and the first key spacers 272 as etch masks.

Through etching the first capping layer 221 and the first sacrificial layer 220, each of a third pattern 256 (i.e., a third mandrel pattern), a fourth pattern 266 (i.e., a fourth mandrel pattern) and a lower key pattern 276 may be formed.

The patterning of the first sacrificial layer 220 and the first capping layer 221 may include etching the first sacrificial layer 220 and the first capping layer 221 using a thickness difference of the second mark generation pattern 273.

The etchant for etching the first capping layer 221 may etch not only the first capping layer 221 but also the first key spacers 272 and the second mark generation pattern 273. The thickness of a portion of the second mark generation pattern 273 where the recess 273r is formed may be less than that of a portion of the second mark generation pattern 273 where the recess 273r is not formed.

In the etching process, the portion of the second mark generation pattern 273 where the recess 273r is formed may be primarily removed. For example, the portion of the second mark generation pattern 273 where the recess 273r is formed may be fully removed while other portions of the second mark generation pattern 273 may still remain.

As mentioned above, through patterning the first sacrificial layer 220 and the first capping layer 221 using the thickness difference of the second mark generation pattern 273, the lower key pattern 276 corresponding to the upper key pattern 271 and the first key spacers 272 may be formed on the first mark generation layer 215.

In an example embodiment, the third pattern 256 and the fourth pattern 266, and the lower key pattern 276 may be concurrently formed.

The third pattern 256 may be formed in the first region I where the first upper spacers 252 are positioned. The third pattern 256 that is disposed on the mask layer 210 of the first region I may include first portions 256a and 256b. The first portion 256b may be formed from the first sacrificial layer 220 and the first portion 256a may be formed from the first capping layer 221.

The fourth pattern 266 may be formed in the second region II where the first pattern 236 is positioned. A dummy mandrel pattern 268 may be formed in the second region II by the first dummy spacers 262.

The fourth pattern 266 that is formed on the mask layer 210 of the second region II may include second portions 266a and 266b. The second portion 266b may be formed from the first sacrificial layer 220 and the second portion 266a may be formed from the first capping layer 221.

The lower key pattern 276 may be formed in the third region III where the second mark generation pattern 273 and the first key spacers 272 are positioned. For example, the lower key pattern 276 may be formed by etching the first capping layer 221 and the first sacrificial layer 220 using the second mark generation pattern 273 having the recess 273r and the first key spacers 272 as etch masks.

Since the second mark generation pattern 273 overlaps the first mark generation layer 215, the lower key pattern 276 may be formed on the first mark generation layer 215. For example, the lower key pattern 276 may be formed to overlap the first mark generation layer 215.

The lower key pattern 276 may include third portions 276a and 276b. The third portion 276b may be formed from the first sacrificial layer 220 and the third portion 276a may be formed from the first capping layer 221.

Figure 10:
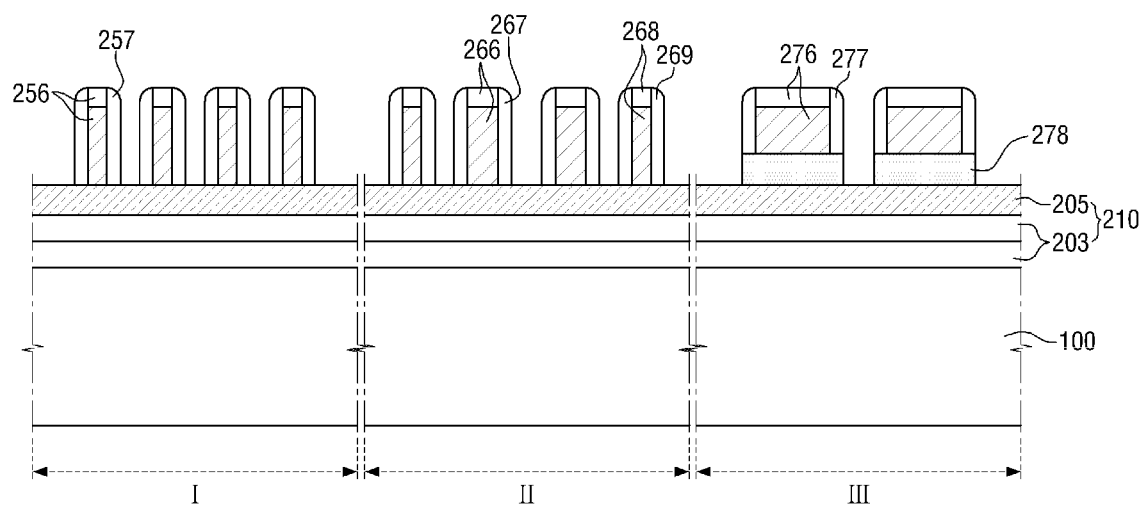

Referring to FIG. 10, a plurality of first lower spacers 257 may be formed on sidewalls of the third pattern 256, and a plurality of second spacers 267 may be formed on sidewalls of the fourth pattern 266. A plurality of second key spacers 277 may be formed on sidewalls of the lower key pattern 276. A plurality of second dummy spacers 269 may be formed on sidewalls of the dummy mandrel pattern 268.

For example, the first lower spacers 257 may be formed on the mask layer 210 of the first region I, the second spacers 267 may be formed on the mask layer 210 of the second region II, and the second key spacers 277 may be formed on the first mark generation layer 215.

For example, a second spacer formation layer may be formed to conformally cover the third pattern 256, the fourth pattern 266, and the lower key pattern 276. Next, through performing an etch-back process, the first lower spacers 257 on the sidewalls of the third pattern 256, the second spacers 267 on the sidewalls of the fourth pattern 266, and the second key spacers 277 on the sidewalls of the lower key pattern 276 are formed, respectively.

The thickness of the second spacer formation layer may be determined in consideration of a distance between first fin-shaped patterns 110 of the first region I that are formed in later processes (See FIG. 13) and/or a distance between second fin-shaped patterns 120 of the second region II that are formed in later processes (See FIG. 13). The distance between the first fin-shaped patterns 110 and/or the distance between the second fin-shaped patterns 120 that are formed in later processes may be less than the resolution limit of conventional photolithography equipment.

The second spacer formation layer may include a material that has an etch selectivity with respect to the third pattern 256, the fourth pattern 266, and the lower key pattern 276. For example, if each of the third pattern 256, the fourth pattern 266, and the lower key pattern 276 includes polycrystalline silicon, an amorphous carbon layer (ACL), a spin-on-hardmask (SOH), or a combination thereof, the second spacer formation layer may include silicon oxide and/or silicon nitride. The second spacer formation layer may be formed through, for example, an ALD process.

In a manufacturing method of a semiconductor device according to some example embodiments of the inventive concepts, the first lower spacers 257, the second spacers 267, and the second key spacers 277 may include silicon oxide.

The first mark generation layer 215 may be patterned using the second key spacers 277 and the lower key pattern 276 as etch masks. For example, a plurality of first mark generation patterns 278 may be formed on the mask layer 210 of the third region III.

For example, after forming the second key spacers 277 on the first mark generation layer 215, a top surface of the mask layer 210 may be partially exposed through etching the first mark generation layer 215 that is not overlapped with the second key spacers 277 and the lower key pattern 276. As a result, the first mark generation patterns 278 may be formed between the lower key pattern 276 and the mask layer 210.

Figure 11:
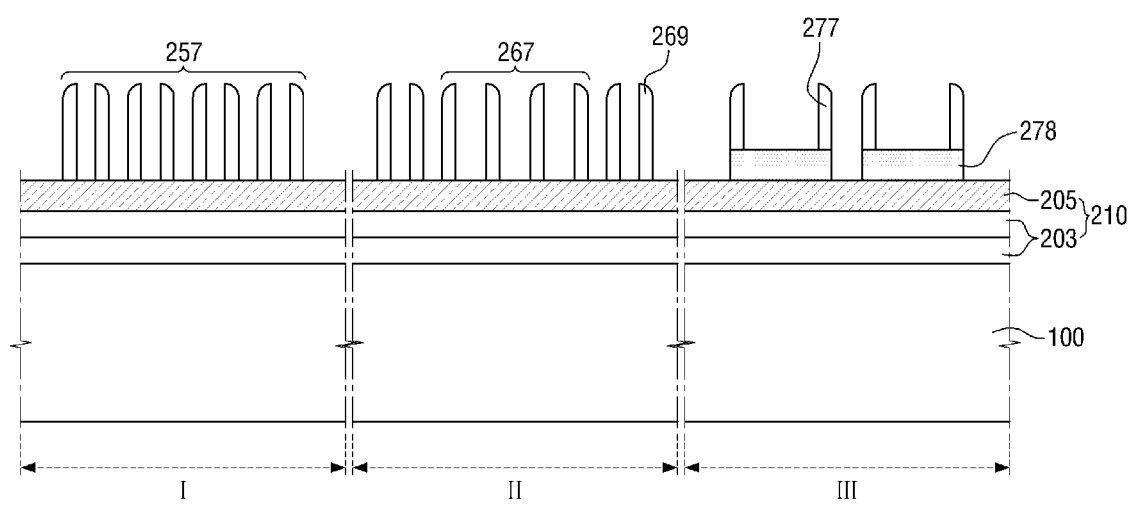

Referring to FIG. 11, the third pattern 256, the fourth pattern 266, the dummy mandrel pattern 268, and the lower key pattern 276 may be removed.

Through selectively removing the third pattern 256, the first lower spacers 257 may be left in the first region I.

Through selectively removing the fourth pattern 266, the dummy mandrel pattern 268, and the lower key pattern 276, the second spacers 267 and the second dummy spacers 269 may be left in the second region II, and the second key spacers 277 and the first mark generation patterns 278 may be left in the third region III.

Figure 12:
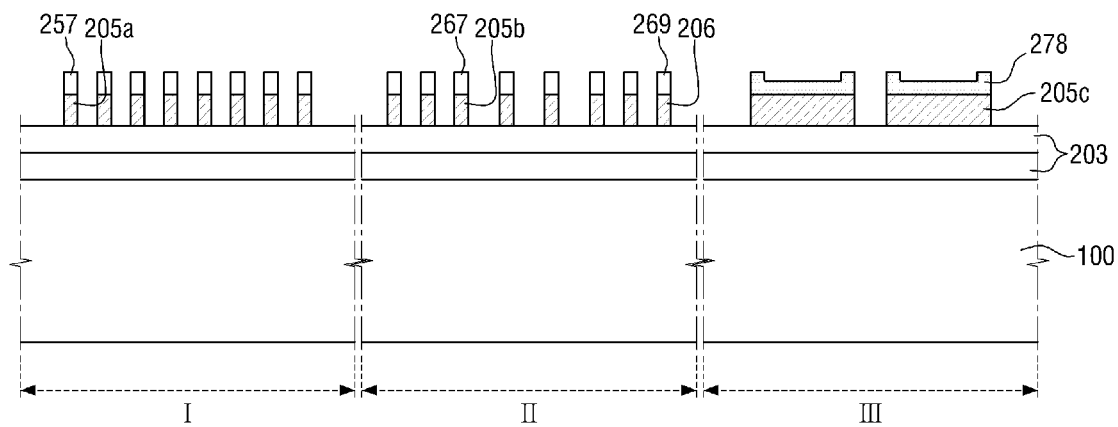

Referring to FIG. 12, the upper mask layer 205 may be patterned using the first lower spacers 257, the second spacers 267, the second dummy spacers 269, the first mark generation pattern 278, and the second key spacers 277 as etch masks.

Through etching the upper mask layer 205, upper mask patterns 205a, 205b, 205c, 206 may be formed. A first portion 205a of the upper mask patterns may be formed in the first region I using the first lower spacers 257 as etch masks. A second portion 205b of the upper mask patterns may be formed in the second region II using the second spacers 267 as etch masks and a third portion 205c of the upper mask patterns may be formed in the third region III using the first mark generation pattern 278 and the second key spacers 277 as etch masks. A fourth portion 206 of the upper mask patterns may be formed in the second region II using the second dummy spacers 269 as etch masks.

Figure 13:
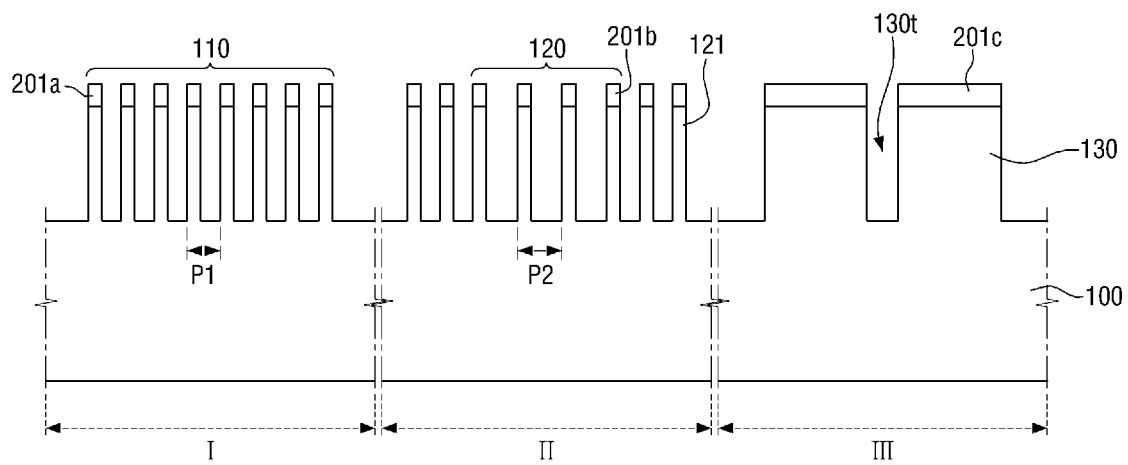

Referring to FIG. 13, the first fin-shaped patterns 110 may be formed in the first region I through partially etching the lower mask layer 203 and the substrate 100 using the first lower spacers 257 and the first portion 205a of the upper mask patterns as etch masks. The second fin-shaped patterns 120 may be formed in the second region II through partially etching the lower mask layer 203 and the substrate 100 using the second spacers 267 and the second portion 205b of the upper mask patterns as etch masks. Dummy fin-shaped patterns 121 may be formed in the second region II through partially etching the lower mask layer 203 and the substrate 100 using the second dummy spacers 269 and the fourth portion 206 of the upper mask patterns as etch masks.

Third fin-shaped patterns 130 and trenches 130t delimiting the third fin-shaped patterns 130 may be formed in the third region III through partially etching the lower mask layer 203 and the substrate 100 using the first mark generation pattern 278 and the third portion 205c of the upper mask patterns as etch masks.

Through etching the substrate 100, a plurality of shallow trenches between the first fin-shaped patterns 110, between the second fin-shaped patterns 120, and between the third fin-shaped patterns 130 may be formed. For example, the trench 130t may be a shallow trench.

A first portion 201a of the first lower mask layer 201 may remain on a top surface of each of the first fin-shaped patterns 110 and a second portion 201b of the first lower mask layer 201 may remain on a top surface of each of the second fin-shaped patterns 120. A third portion 201c of the first lower mask layer 201 may remain on a top surface of each of the third fin-shaped patterns 130

In a manufacturing method of a semiconductor device according to some example embodiments of the inventive concepts, a first pitch P1 between the first fin-shaped patterns 110 of the first region I may differ from a second pitch P2 between the second fin-shaped patterns 120 of the second region II. For example, the first pitch P1 between the first fin-shaped patterns 110 of the first region I may be less than the second pitch P2 between the second fin-shaped patterns 120 of the second region II.

The first fin-shaped pattern 110 of the first region I may be formed through a quadruple patterning technology (QPT), and the second fin-shaped pattern 120 of the second region II may be formed through a double patterning technology (DPT). Since the QPT may form a pattern having a pitch less than that of the DPT, the first pitch P1 between the first fin-shaped patterns 110 of the first region I may be less than the second pitch P2 between the second fin-shaped patterns 120 of the second region II, but the invention is not limited thereto.

The third fin-shaped pattern 130 and the trench 130t in the third region III may be a trench key. For example, the trench key may be used as an align mark in a subsequent process. A bottom surface of the trench 130t and/or the top surface of the third fin-shaped pattern 130 may be used as an align mark.

In certain embodiments, the mask layer 210 may not be formed between the substrate 100 and the first sacrificial layer 220. For example, the mask layer 210 may be skipped. In this case, the first fin-shaped pattern 110 may be formed using the first lower spacers 257 as an etch mask, the second fin-shaped pattern 120 may be formed using the second spacers 267 as an etch mask, and the third fin-shaped pattern 130 may be formed using the first mark generation patterns 278 and the second key spacers 277 as an etch mask. For example, the first fin-shaped pattern 110, the second fin-shaped pattern 120, and the third fin-shaped pattern 130 are formed by the etch rate differences between the material of the substrate 100 and the materials of the first lower spacers 257, the second spacers 267, and the second key spacers 277 and the first mark generation patterns 278. For example, the etch rate of the substrate 100 may be faster than the etch rates of the second spacer formation layer and/or first preliminary mark generation layer 211.

In certain embodiments that have a mask layer 210, the etch rate of the mask layer 210 may be lower than the etch rates of the first lower spacers 257, the second spacers 267, the second key spacers 277, and/or the first mark generation patterns 278.

Figure 14:
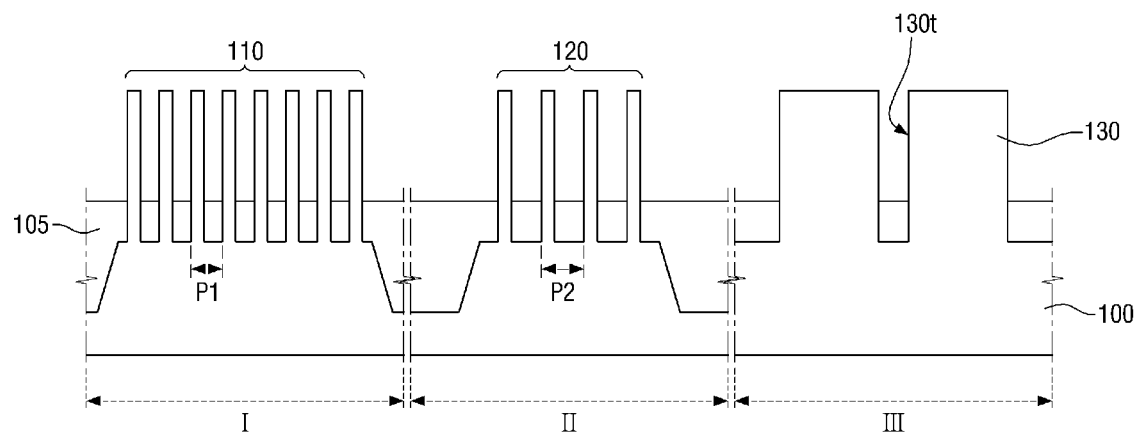

Referring to FIG. 14, a field insulating layer 105 may be formed on the substrate 100 such that top portions of the first fin-shaped patterns 110, the second fin-shaped patterns 120, and the third fin-shaped patterns 130 are exposed.

For example, top portions of the first fin-shaped patterns 110, the second fin-shaped patterns 120, and the third fin-shaped patterns 130 may upwardly protrude from a top surface of the field insulating layer 105.

In an example embodiment, after forming an insulating layer that fills the shallow trenches between the first fin-shaped patterns 110, between the second fin-shaped patterns 120, and between the third fin-shaped patterns 130, a preliminary field insulating layer may be formed through performing a planarization process (e.g., a CMP process or an etch-back process) such that the first portion 201a, the second portion 201b, and the third portion 201c of the first lower mask layer 201 are exposed.

Next, after deep trenches are selectively formed in the substrate 100 (e.g., between the first fin-shaped pattern 110 and the second fin-shaped pattern 120, and/or between the second fin-shaped pattern 120 and the third fin-shaped pattern 130), an additional insulating layer may be formed to fill the deep trenches.

Next, the field insulating layer 105 may be formed through partially etching the preliminary field insulating layer and the additional insulating layer such that upper portions of the first fin-shaped patterns 110, the second fin-shaped patterns 120, and the third fin-shaped patterns 130 are exposed. The first portion 201a, the second portion 201b, and the third portion 201c of the first lower mask layer 201 may be removed. However, the invention is not limited thereto. For example, the deep trench may not be formed.

For example, in the process of forming the deep trench, the dummy fin-shaped patterns 121 may be removed, but the invention is not limited thereto.

In an example embodiment, after forming deep trenches, an insulating layer may be formed to fill the shallow trenches and the deep trenches. Next, the field insulating layer 105 may formed through partially etching the insulating layer such that upper portions of the first fin-shaped patterns 110, the second fin-shaped patterns 120, and the third fin-shaped patterns 130 are exposed.

Referring to FIGS. 15 through 21, a method of manufacturing a fin-type field effect transistor (FinFET) as an example of a semiconductor device will be described.

Figure 15:
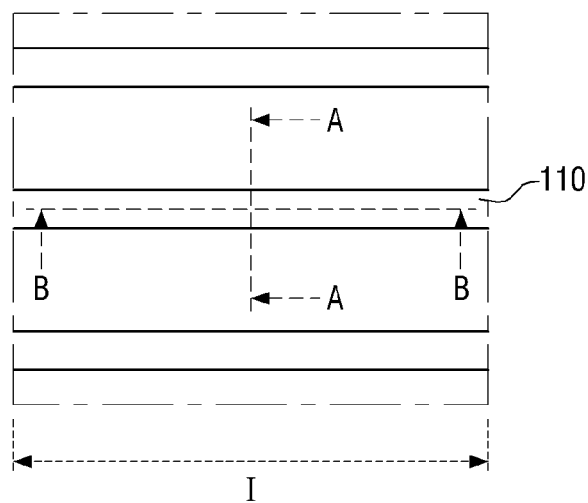

FIGS. 15 through 21 are views illustrating a method of manufacturing a fin-type field effect transistor (FinFET) using a semiconductor device manufactured according to an example embodiment of the inventive concepts. FIG. 15 illustrates a plan view of the first region I of FIG. 14. FIGS. 16 through 21 illustrate cross-sectional views taken along the lines A-A and B-B of FIG. 15.

Figure 16:
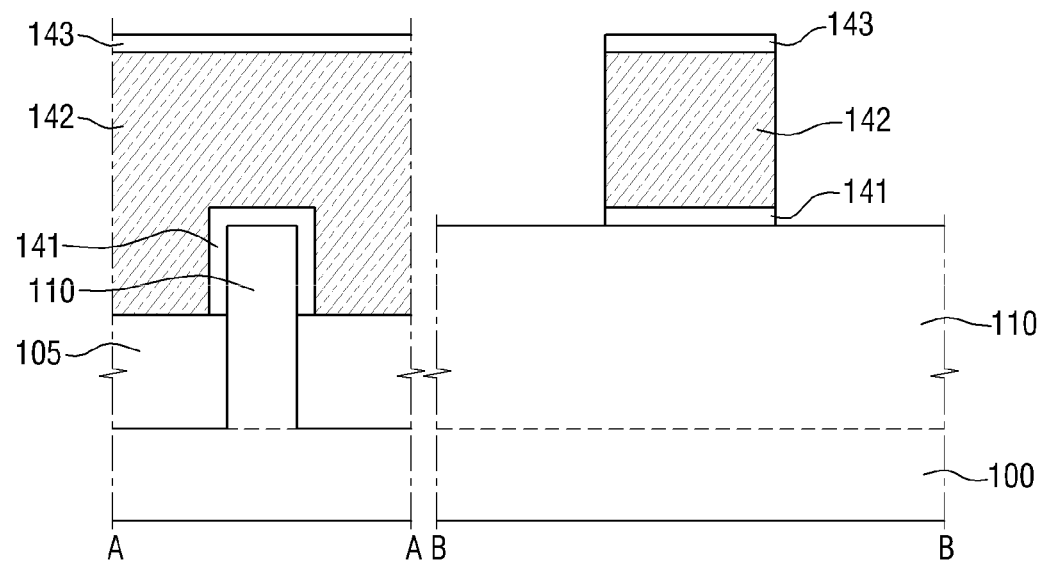

Referring to FIGS. 15 and 16, a dummy gate electrode 142 may be formed to cross the first fin-shaped patterns 110 through an etch process using a gate mask pattern 143.

Therefore, the dummy gate electrode 142 may be formed on the first fin-shaped patterns 110. The dummy gate electrode 142 may partially overlap with the first fin-shaped patterns 110.

The dummy gate electrode 142 may include, for example, polycrystalline silicon, and/or amorphous silicon, but the invention is not limited thereto. The gate mask pattern 143 may include, for example, silicon oxide, silicon nitride, and/or silicon oxynitride, but the invention is not limited thereto.

A dummy gate insulation layer 141 may be disposed between the dummy gate electrode 142 and the first fin-shaped patterns 110. The dummy gate insulation layer 141 may be conformally formed along outer surfaces of the first fin-shaped patterns 110 that upwardly protrude from the top surface of the field insulating layer 105.

The dummy gate insulation layer 141 may be formed through, for example, a chemical oxidation process, an ultraviolet (UV) oxidation process, a dual plasma oxidation process, a thermal oxidation process, a CVD process, or an ALD process, but the invention is not limited thereto.

In FIG. 16, the dummy gate insulation layer 141 is not formed between the field insulating layer 105 and the dummy gate electrode 142, for convenience of explanation, but the invention is not limited thereto. According to a method of forming the dummy gate insulation layer 141, the dummy gate insulation layer 141 may be disposed between the field insulating layer 105 and the dummy gate electrode 142.

Figure 17:
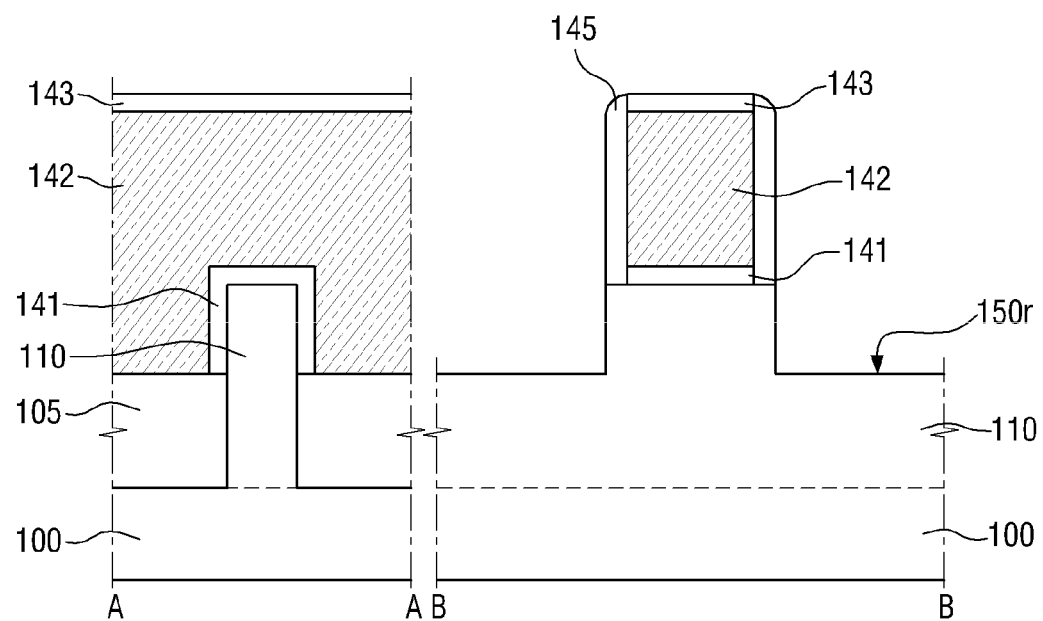

Referring to FIG. 17, gate spacers 145 may be formed on sidewalls of the dummy gate electrode 142.

For example, after forming an insulating layer on the dummy gate electrode 142, the gate spacers 145 may be formed through an etch-back process. A top surface of the first fin-shaped patterns 110 that are not overlapped with the dummy gate electrode 142 and the gate spacers 145 may be exposed.

Each of the gate spacers 145 may include silicon nitride (SiN), silicon oxynitride (SiON), silicon oxide (SiO2), silicon oxy-carbide nitride (SiOCN), or a combination thereof, but the invention is not limited thereto.

Next, recesses 150r may be formed in the first fin-shaped patterns 110 by partially removing the exposed first fin-shaped patterns 110 at opposite sides of the dummy gate electrode 142.

Figure 18:
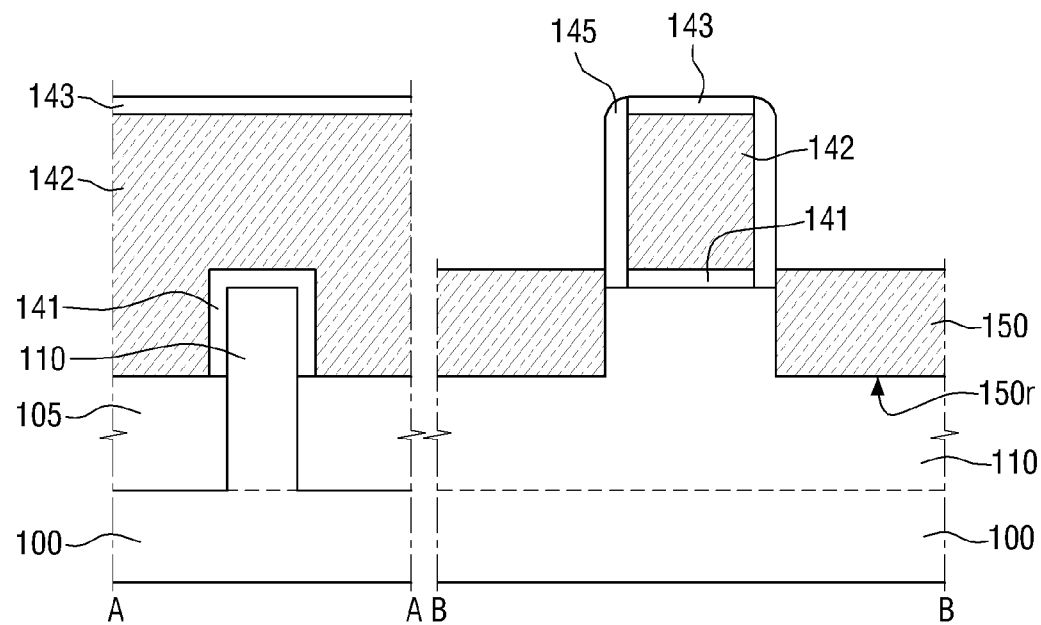

Referring to FIG. 18, source/drain regions 150 may be formed on the first fin-shaped patterns 110 at opposite sides of the dummy gate electrode 142.

The source/drain regions 150 may be formed to fill the recesses 150r. The source/drain regions 150 may be formed through a selective epitaxial growth (SEG) process. Each of the source/drain regions 150 may be, for example, an elevated source/drain region.

As illustrated in FIGS. 17 and 18, after forming the recesses 150r in the first fin-shaped patterns 110 at opposite sides of the dummy gate electrode 142, the source/drain regions 150 may be formed using an epitaxial growth process, but the invention is not limited thereto.

In an example embodiment, without forming the recesses 150r in the first fin-shaped patterns 110 at opposite sides of the dummy gate electrode 142, a source/drain region may be formed by forming an epitaxial layer on the first fin-shaped patterns 110 that upwardly protrude from the top surface of the field insulating layer 105.

Figure 19:
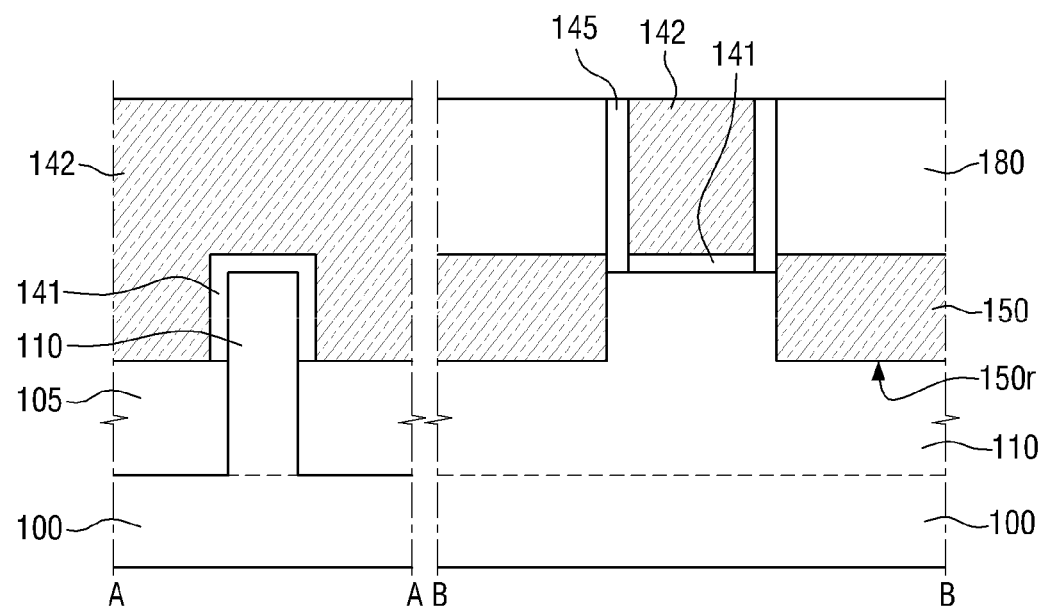

Referring to FIG. 19, an interlayer insulating layer 180 may be formed on the substrate 100 so as to cover the source/drain regions 150.

Next, the interlayer insulating layer 180 may be planarized until the dummy gate electrode 142 is exposed. Therefore, the gate mask pattern 143 may be removed, and a top surface of the dummy gate electrode 142 may be exposed.

The interlayer insulating layer 180 may include silicon oxide, silicon nitride, silicon oxynitride, tetra ethyl ortho silicate (TEOS), flowable oxide (FOX), tonen silazen (TOSZ), undoped silica grass (USG), borosilica glass (BSG), phosphosilica glass (PSG), borophosphosilica glass (BPSG), plasma enhanced tetra ethyl ortho silicate (PE-TEOS), a low dielectric constant material, or a combination thereof. The low dielectric constant material may include, fluoride silicate glass (FSG), carbon doped silicon oxide (CDO), xerogel, aerogel, amorphous fluorinated carbon (AFC), organo silicate glass (OSG), parylene, bis-benzocy-clobutenes (BCB), polyimide, porous polymeric material, or a combination thereof, but the invention is not limited thereto.

The interlayer insulating layer 180 may be formed through, for example, a physical vapour deposition (PVD) process, a chemical vapour deposition (CVD) process, an atomic layer deposition (ALD) process, a spin coating process, or a combination thereof, but the invention is not limited thereto.

Figure 20:
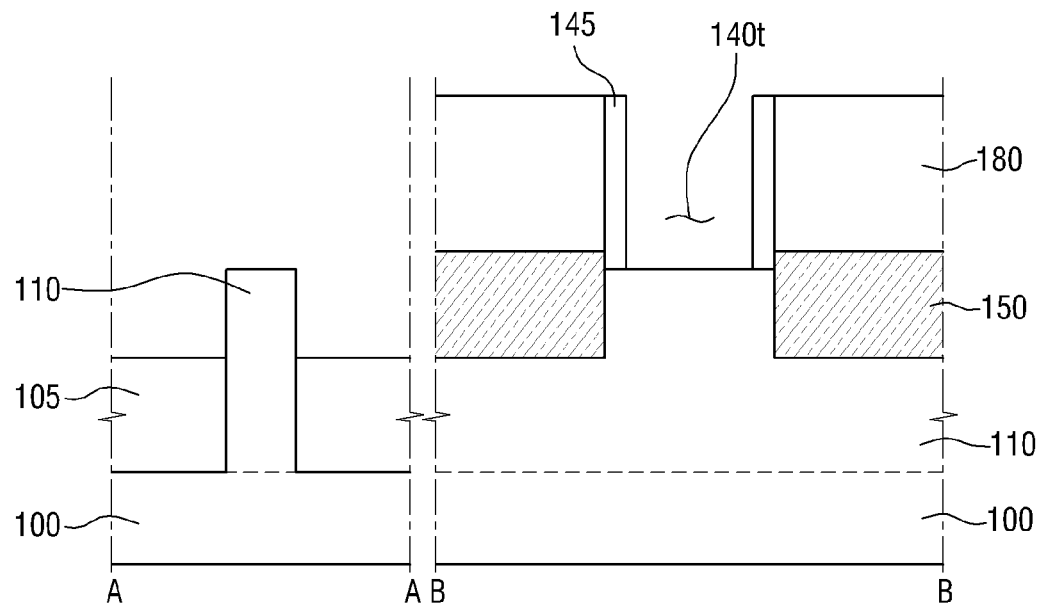

Referring to FIG. 20, a gate trench 140t may be formed by removing the dummy gate electrode 142 and the dummy gate insulation layer 141.

The gate trench 140t may be defined by sidewalls of the gate spacers 145. The field insulating layer 105 may be exposed through the gate trench 140t. The first fin-shaped patterns 110 may be partially exposed through the gate trench 140t.

Figure 21:
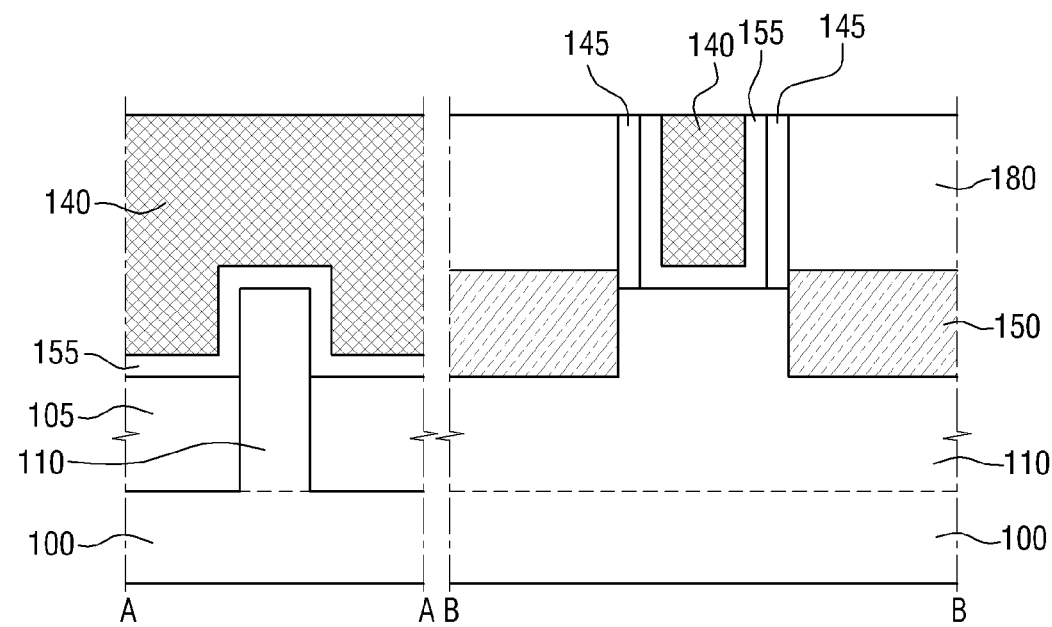

Referring to FIG. 21, a gate insulation layer 155 and a gate electrode 140 may be formed in the gate trench 140t.

The gate insulation layer 155 may be formed along inner side surfaces and a bottom surface of the gate trench 140t. The gate insulation layer 155 may be formed along outer surfaces of the first fin-shaped patterns 110 that upwardly protrude from the top surface of the field insulating layer 105. The gate insulation layer 155 may extend along the top surface of the field insulating layer 105.

The gate insulation layer 155 may include an interfacial layer that is formed along outer surfaces of the first fin-shaped patterns 110.

The gate insulation layer 155 may include silicon oxide, silicon oxynitride, silicon nitride, hafnium oxide, hafnium silicon oxide, lanthanum oxide, lanthanum aluminium oxide, zirconium oxide, zirconium silicon oxide, tantalum oxide, titanium oxide, barium strontium titanium oxide, barium titanium oxide, strontium oxide, yttrium oxide, aluminium oxide, lead scandium tantalum oxide, lead zinc niobate, or a combination thereof, but the invention is not limited thereto.

The gate electrode 140 may include polycrystalline silicon, amorphous silicon, titanium (Ti), titanium nitride (TiN), tungsten nitride (WN), titanium aluminium (TiAl), titanium aluminium nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminium (Al), tungsten (W), or a combination thereof.

The gate electrode 140 may be formed through a replacement process (i.e., a gate last process), but the invention is not limited thereto.

According to example embodiments of the inventive concepts, fin-shaped patterns having various pitches may be concurrently formed. For example, a fin-shaped pattern of a fine width and a trench key may be concurrently formed. Accordingly, the process may be simplified.

Figure 22:
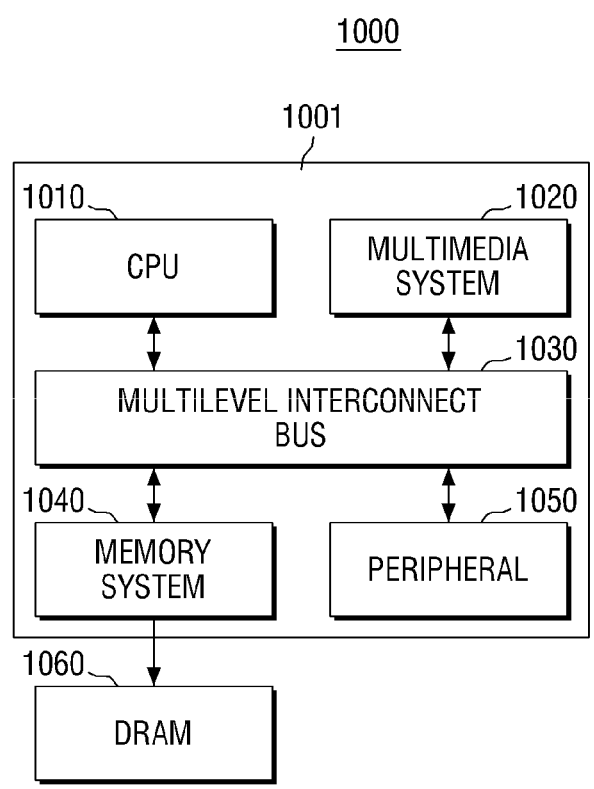

FIG. 22 illustrates a block diagram of a system-on-chip (SoC) system including a semiconductor device manufactured according to an example embodiment of the inventive concepts.

Referring to FIG. 22, the SoC system 1000 may include an application processor (AP) 1001 and a dynamic random access memory (DRAM) 1060.

The AP 1001 may include a central processing unit (CPU) 1010, a multimedia system 1020, a multilevel interconnect bus 1030, a memory system 1040, and a peripheral circuit 1050.

The CPU 1010 may perform the operation necessary for driving the SoC system. According to some example embodiments of the inventive concepts, the CPU 1010 may be configured to a multi-core environment including a plurality of cores.

The multimedia system 1020 may be used to perform a variety of multimedia functions in the SoC system 1000. The multimedia system 1020 may include a 3D engine, a module, a video codec, a display system, a camera system, or a post-processor.

Through the bus 1030, the CPU 1010, the multimedia system 1020, the memory system 1040, and the peripheral circuit 1050 may communicate with each other. According to some example embodiments of the inventive concepts, the bus 1030 may have a multilayer structure (e.g., a multilayer advanced high performance bus (AHB), or a multilayer advanced extensible interface (AXI)), but, the invention is not limited thereto.

The memory system 1040 may provide an environment for high speed operation of the AP 1001 electrically connected to an external memory (i.e., DRAM 1060). According to some example embodiments of the inventive concepts, the memory system 1040 may include a controller (e.g., DRAM controller) for controlling the external memory (e.g., DRAM 1060).

The peripheral circuit 1050 may provide an environment for allowing the SoC system 1000 to be easily connected to an external device (e.g., a main board). For example, the peripheral circuit 1050 may include various interfaces for allowing the external device connected to the SoC system 1000 to be compatible.

The DRAM 1060 may function as an operation memory for operating the AP 1001. According to some example embodiments of the inventive concepts, the DRAM 1060 may be disposed outside the AP 1001, as shown in FIG. 22. For example, the DRAM 1060 may be packaged in a form of a package on package (POP) in conjunction with the AP 1001.

At least one of the components of the SoC system 1000 may include at least one of the semiconductor devices according to example embodiments of the inventive concepts described above.

Figure 23:
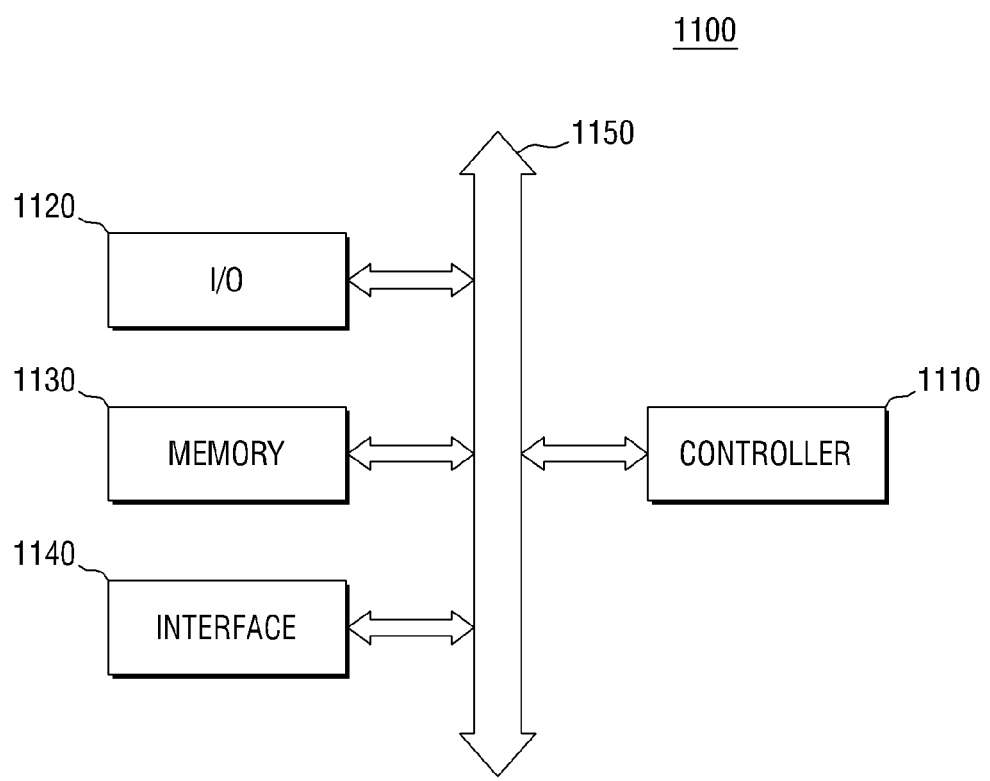

FIG. 23 illustrates a block diagram of an electronic device including a semiconductor device manufactured according to an example embodiment of the inventive concepts.

Referring to FIG. 23, the electronic device 1100 may include a controller 1110, an input/output (I/O) device 1120, a memory device 1130, an interface 1140, and a bus 1150. The controller 1110, the I/O device 1120, the memory device 1130, and/or the interface 1140 may communicate with each other through the bus 1150. The bus 1150 may correspond to a path where data are transferred.

The controller 1110 may include at least one of a microprocessor, a digital signal processor, a microcontroller, and a logic device capable of performing functions similar to those. The I/O device 1120 may include a keypad, a keyboard, and a display device. The memory device 1130 may store data and/or commends. The interface 1140 may transfer data to a communication network or receive data from the communication network. The interface 1140 may be a wired or a wireless interface. For example, the interface 1140 may include an antenna or a wired and wireless transceiver.

Although not shown, the electronic device 1100 may further include a high speed DRAM and/or a static random access memory (SRAM) as an operation memory for improving the operation of the controller 1110.

The semiconductor device manufactured according to example embodiments of the inventive concepts described above, may be provided in the memory device 1130 or may be provided as respective parts of the controller 1110 and/or the I/O device 1120.

The electronic device 1100 may be applied to a personal digital assistant (PDA), a portable computer, a web tablet, a wireless phone, a mobile phone, a digital music player, a memory card, or all electronic products which are able to transfer and/or receive information in a wireless environment.

Figure 24:
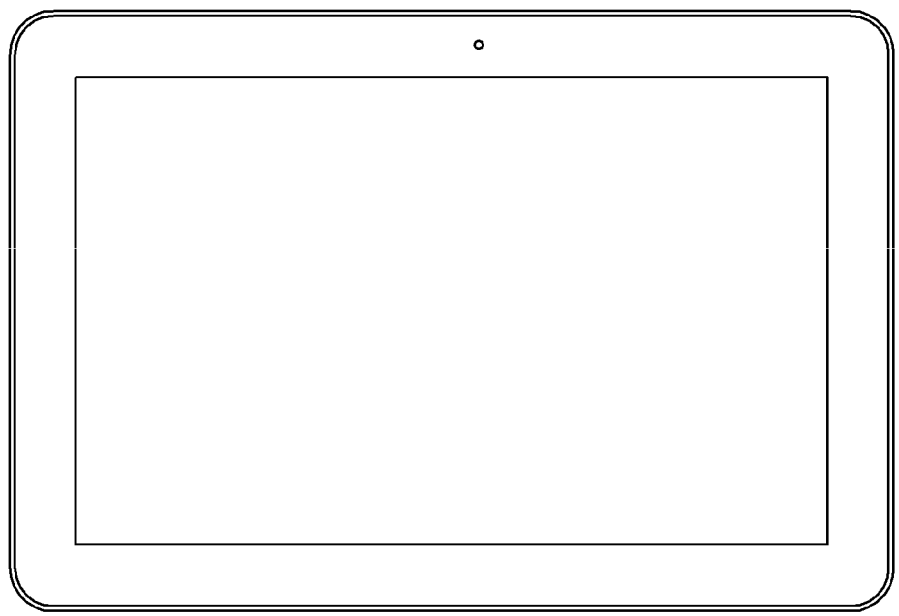
Figure 25:
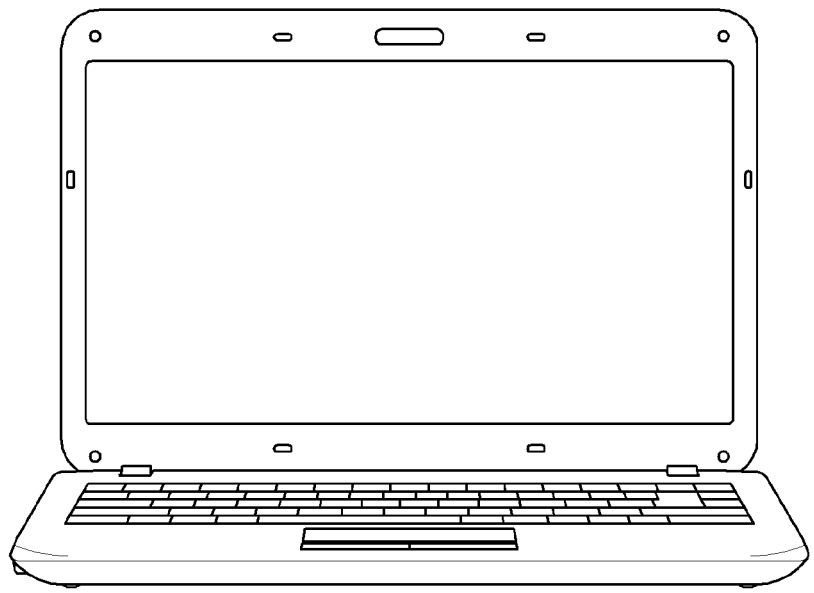
Figure 26:
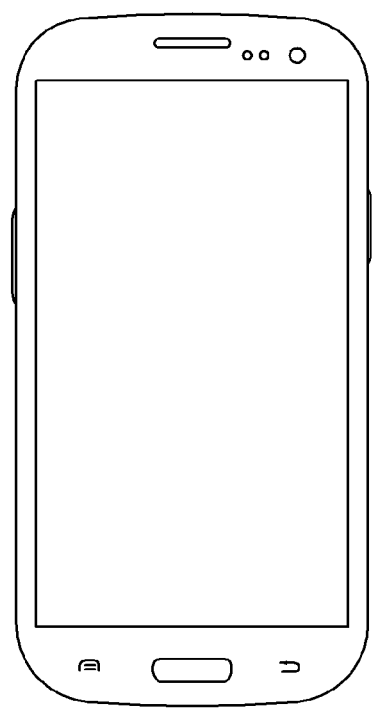

FIGS. 24 through 26 illustrate electronic devices including a semiconductor device manufactured according to an example embodiment of the inventive concepts.

FIG. 24 illustrates a view of a tablet PC 1200, FIG. 25 illustrates a view of a laptop PC 1300, and FIG. 26 illustrates a view of a smart phone 1400. The semiconductor device manufactured according to example embodiments of the inventive concepts described above may be used to the tablet PC 1200, the laptop PC 1300, and/or the smart phone 1400, but the invention is not limited thereto.

In some example embodiments of the inventive concepts, the electronic device may be implemented in a computer, an ultra mobile PC (UMPC), a workstation, a net book, a PDA, a portable computer, a wireless phone, a mobile phone, an e-book, a portable multimedia player (PMP), a portable game machine, a navigation device, a black box, a digital camera, a 3-dimentional television, a digital audio recorder, a digital audio player, a digital picture recorder, a digital picture player, a digital video recorder, or a digital video player.

While the inventive concept has been particularly shown and described with reference to example embodiments thereof, it will be understood that various changes in form and details may be made therein without departing from the spirit and scope of the following claims.

What is claimed is:

1. A method of manufacturing a semiconductor device, the method comprising:

forming a first sacrificial layer on a substrate including a first region and a second region;

forming a first pattern on the first sacrificial layer in the first region and a first mark generation layer on the first sacrificial layer in the second region;

forming a first key pattern on the first mark generation layer;

forming a first mark generation pattern by partially etching the first mark generation layer using the first key pattern as an etch mask;

forming a second pattern by etching the first sacrificial layer in the first region using the first pattern as an etch mask;

forming a second key pattern by etching the first sacrificial layer in the second region using the first mark generation pattern as an etch mask;
forming first spacers on sidewalls of the second pattern and first key spacers on sidewalls of the second key pattern;
forming first fin-shaped patterns in the first region by partially etching the substrate using the first spacers as etch masks; and
forming a trench key in the second region.

2. The method of claim 1, further comprising forming a second mark generation layer between the substrate and the first sacrificial layer in the second region,
wherein the second key pattern is formed on the second mark generation layer and overlaps with the second mark generation layer.

3. The method of claim 2, further comprising:
forming a second mark generation pattern by etching the second mark generation layer using the second key pattern and the first key spacers as etch masks;
removing the second key pattern; and
forming the trench key by partially etching the substrate using the second mark generation pattern as an etch mask.

4. The method of claim 3, further comprising:
forming a mask layer between the substrate and the second mark generation layer,
wherein the mask layer includes a lower mask layer and an upper mask layer sequentially stacked on the substrate, and
the second mark generation layer includes a material that has a high etch selectivity with respect to the upper mask layer.

5. The method of claim 4, further comprising:
etching the mask layer using the second mark generation pattern as an etch mask to form a mask pattern.

6. The method of claim 5, further comprising:
etching the substrate using the mask pattern as an etch mask to form the trench key.

7. The method of claim 1, further comprising:
forming a blocking pattern covering the first pattern in the first region,
wherein the step of forming the blocking pattern is performed by the same photolithography process forming the first key pattern.

8. The method of claim 7, further comprising:
forming a second sacrificial layer covering the first pattern and the first mark generation layer on the first sacrificial layer; and
patterning the second sacrificial layer to form the first key pattern and the blocking pattern.

9. The method of claim 1, further comprising:
forming second key spacers on sidewalls of the first key pattern; and
forming a recess in the first mark generation layer by partially etching the first mark generation layer using the first key pattern and the second key spacers as etch masks to form the first mark generation pattern.

10. The method of claim 9, further comprising:
after removing the first key pattern, etching the first sacrificial layer using the second key spacers and the first mark generation pattern as etch masks to form the second key pattern.

11. The method of claim 1, wherein the substrate further includes a third region, and the method further comprises forming a third pattern on the first sacrificial layer in the third region with the same process forming the first key pattern.

12. The method of claim 11, further comprising:
forming second spacers on sidewalls of the third pattern;
forming a fourth pattern by etching the first sacrificial layer using the second spacers as etch masks;
forming third spacers on sidewalls of the fourth pattern; and
forming second fin-shaped patterns in the third region, by partially etching the substrate using the third spacers as etch masks.

13. The method of claim 12, wherein a first pitch of the first fin-shaped patterns is formed to be greater than a second pitch of the second fin-shaped patterns.

14. The method of claim 1, wherein the first mark generation layer is not formed in the first region.

15. A method of manufacturing a semiconductor device, the method comprising:
sequentially forming a mask layer, a first mark generation layer, and a first sacrificial layer on a substrate including a first region, a second region, and a third region, the first mark generation layer being formed between the mask layer and the first sacrificial layer in the third region;
forming a first pattern on the first sacrificial layer in the second region and a second mark generation layer on the first sacrificial layer of the third region;
forming a second pattern on the first sacrificial layer in the first region, a blocking pattern covering the first pattern, and a first key pattern on the second mark generation layer;
forming first spacers on sidewalls of the second pattern and first key spacers on sidewalls of the first key pattern;
forming a second mark generation pattern by partially etching the second mark generation layer using the first key pattern and the first key spacers as etch masks;
after forming the second mark generation pattern, removing the second pattern, the blocking pattern, and the first key pattern;
forming a third pattern in the first region by etching the first sacrificial layer using the first spacers as etch masks;
forming a fourth pattern in the second region by etching the first sacrificial layer using the first pattern as an etch mask;
forming a second key pattern on the first mark generation layer by etching the first sacrificial layer using the second mark generation pattern as an etch mask;
forming second spacers on sidewalls of the third pattern, third spacers on sidewalls of the fourth pattern, and second key spacers of sidewalls of the second key pattern; and
forming a first mark generation pattern exposing a top surface of the mask layer by etching the first mark generation layer using the second key pattern and the second key spacers as etch masks.

16. The method of claim 15, further comprising:
removing the second key pattern, the third pattern, and the fourth pattern; and
forming first fin-shaped patterns in the first region, second fin-shaped patterns in the second region, and a trench key in the third region using the second spacers, the third spacers, and the first mark generation pattern, respectively.

17. A method of manufacturing a semiconductor device having a first region and a second region, the method comprising:
- providing a substrate including in the first region and in the second region;
- forming a first sacrificial layer on the substrate in the first region and in the second region;
- forming a first pattern on the first sacrificial layer in the second region;
- forming a first layer on the substrate in the first region and the second region, the first layer covering the first pattern;
- after forming the first pattern, patterning the first layer to form be a patterned first layer, the patterned first layer including a second pattern on the first sacrificial layer in the first region,
- wherein the first pattern in the second region is covered with the patterned first layer after the second pattern is formed;
- forming in the first region first upper spacers on opposite sidewalls of the second pattern in the first region;
- removing the second pattern in the first region;
- etching the first sacrificial layer in the first region using the first upper spacers as an etch mask to form a third pattern in the first region;
- etching the first sacrificial layer in the second region using the first pattern as an etch mask to form a fourth pattern in the second region;
- forming in the first region first lower spacers at opposite sidewalls of the third pattern;
- forming in the second region second lower spacers on opposite sidewalls of the fourth pattern;
- removing the third pattern and the fourth pattern; and
- etching the substrate in the first region and the second region using the first lower spacers and the second lower spacers as etch masks.

18. The method of claim 17, further comprising:
- forming a mask layer between the substrate and the first sacrificial layer,
- wherein etching the substrate using the first lower spacers and the second lower spacers as etch masks etches the mask layer firstly to form a mask pattern, and the etching the substrate uses the mask pattern, the first lower spacers, and the second lower spacers as etch masks.

19. The method of claim 17, further comprising:
- forming a mask layer on the substrate;
- forming a first mark generation layer on the mask layer in a third region of the substrate; and
- forming a second mark generation layer overlapping the first mark generation layer,
- wherein the second mark generation layer is formed by the same photolithography process forming the first pattern.

20. The method of claim 19, further comprising:
- etching the first mark generation layer to form a first mark generation pattern;
- etching the mask layer using the first mark generation pattern as an etch mask to form a mask pattern; and
- etching the substrate using the mask pattern as an etch mask to form a trench key.

* * * * *